US005970007A

United States Patent [19]

Shiratake

[11] Patent Number: 5,970,007

[45] Date of Patent: Oct. 19, 1999

[54] SEMICONDUCTOR INTEGRATED CIRCUIT DEVICE

[75] Inventor: Shinichiro Shiratake, Yokohama, Japan

[73] Assignee: Kabushiki Kaisha Toshiba, Kawasaki, Japan

[21] Appl. No.: 09/089,506

[22] Filed: Jun. 3, 1998

[30] Foreign Application Priority Data

Jun. 6, 1997 [JP] Japan .................................... 9-149159

[51] Int. Cl.[6] ........................................ G11C 7/02

[52] U.S. Cl. ........................... 365/207; 365/208; 365/203

[58] Field of Search .................................... 365/207, 208, 365/203, 190, 226

[56] References Cited

U.S. PATENT DOCUMENTS

| | | | |
|---|---|---|---|
| 5,220,527 | 6/1993 | Ohsawa | 365/207 |
| 5,267,203 | 11/1993 | Hwang et al. | 365/190 |
| 5,572,475 | 11/1996 | Yim et al. | 365/208 |
| 5,590,080 | 12/1996 | Hasagawa et al. | 365/207 |
| 5,610,868 | 3/1997 | Inaba et al. | 365/208 |
| 5,875,141 | 2/1999 | Shirley et al. | 365/207 |

OTHER PUBLICATIONS

M. Nakamura et al: 1995 IEEE ISSCC Digest Tech. Papers; FA 14.2: A 29ns 64Mb DRAM with Hierarchical Array Architecture; Feb. 17, 1995; pp. 246–247.

*Primary Examiner*—Trong Phan
*Attorney, Agent, or Firm*—Banner & Witcoff, Ltd.

[57] ABSTRACT

A semiconductor memory device having a sense amplifier, comprises an n-type sense amplifier formed of an nMOS transistor with a source connected to a bit line and a gate connected to an inverted bit line, and an nMOS transistor with a source connected to the inverted bit line and a gate connected to the bit line. In activating the n-type sense amplifier, the voltage of a control signal line is set to a voltage Vss2 lower than a ground voltage Vss. In restoring data in a capacitor of a memory cell, the voltage of the control signal line is set to the ground voltage Vss. With this setting, the sense amplifier can operate at an ultra-low voltage and can ensure a satisfactory operation margin.

18 Claims, 22 Drawing Sheets

SEMICONDUCTOR INTEGRATED CIRCUIT DEVICE

BACKGROUND OF THE INVENTION

The present invention relates to a semiconductor integrated circuit device and, more particularly, to a semiconductor integrated circuit device having a dynamic memory cell with a bit line sense amplifier which steadily operates even at a low voltage.

This application is based on Japanese Patent Application No. 9-149159, filed Jun. 6, 1997, the content of which is incorporated herein by reference.

Along with the advance in manufacturing techniques relating to a semiconductor device, the scales of elements used in semiconductor memory devices are being decreased. Accordingly, with a conventional power supply voltage Vcc, the field density at each portion of the element is too high, and the reliability of the device is degraded. To suppress the degradation of the reliability, the operation power supply voltage Vcc is decreased. For example, the power supply voltage is 5V in a 1-Mbit DRAM, but 3.3V in most 16-Mbit DRAMs mass-produced at present.

The decrease in power supply voltage Vcc yields a secondary advantage, i.e., reduction in power consumption. Therefore, the technique of decreasing the power supply voltage Vcc is important in the fields of semiconductor memory devices and semiconductor integrated circuit devices.

Recently, portable data processing devices such as a PDA (Personal Digital Assistants) are rapidly spread because of small sizes, high performance, and advanced functions. Particularly in recent years, along with the advance in functions, semiconductor memories such as a DRAM are also incorporated in the internal systems of portable data processing devices.

To realize smaller-size, higher-performance portable data processing devices with more advanced functions, the operation voltage of the semiconductor memory is further decreased. That is, the power supply voltage is decreased from 3.3V to 1 to 1.5V. As a result, the portable data processing device can be further decreased in power consumption and can operate with a battery.

In addition, ultra-low-power-supply-voltage operation semiconductor memories which operate at a power supply voltage Vcc of 1V or less are also developed. Such a semiconductor memory is useful in not only portable data processing devices but also other electronic devices.

As the power supply voltage Vcc decreases to a low or ultra low voltage, it becomes difficult to meet demands for a bit line sense amplifier, i.e., to detect and amplify a small data signal from a memory cell.

A typical bit line sense amplifier will be described below.

FIG. 18 is a circuit diagram of a typical bit line sense amplifier used in a conventional DRAM. FIG. 19 is an operation waveform chart of the sense amplifier.

The circuit arrangement will be explained.

As shown in FIG. 18, a bit line BL connected to a dynamic memory cell MC1 and an inverted bit line /BL ("/" means "inverted" hereinafter) connected to another memory cell MC2 are arranged. The bit line BL and the inverted bit line /BL are paired (to be referred to as a pair of bit lines hereinafter).

The memory cell MC1 comprises a transfer gate transistor TR1 and a memory capacitor C1. The transfer gate transistor TR1 has a current path and a gate electrode connected to a word line WL1. One end of the current path is connected to the bit line BL. Two electrodes of the memory capacitor C1 are connected to the other end of current path of the transfer gate transistor TR1 and a plate electrode, respectively. The electrical charge of memory data is stored at a contact node of the TR1 and C1 (a storage node). The plate electrode receives a plate voltage VPL. Similarly, the memory cell MC2 comprises a transfer gate transistor TR2 and a memory capacitor C2. The transfer gate transistor TR2 has a current path and a gate electrode connected to a word line WL2. One end of the current path is connected to the inverted bit line /BL. Two electrodes of the memory capacitor C2 are connected to the other end of current path of the transfer gate transistor TR1 and a plate electrode, respectively. The electrical charge of memory data is stored at a contact node of the TR2 and C2 (a storage node). The plate electrode receives the plate voltage VPL.

The pair of bit lines are connected to a bit line pair equalizer 10, an n-type sense amplifier 11, and a p-type sense amplifier 12.

The bit line pair equalizer 10 comprises an n-channel MOSFET (to be referred to as an nMOS transistor hereinafter) N3 with a current path series-connected between the bit line BL and the inverted bit line /BL, an nMOS transistor N4 which has one current path end connected to the bit line BL and receives, at the other end, an intermediate voltage Vcc/2 between a high voltage Vcc and a low voltage Vss (for example, ground voltage), and an nMOS transistor N5 which has one current path end connected to the inverted bit line /BL and receives the intermediate voltage at the other end. The gates of the NMOS transistors N3 to N5 receive a precharge signal PRC.

The n-type sense amplifier 11 comprises an nMOS transistor N1 with one current path end connected to the bit line BL and a gate connected to the inverted bit line /BL, and an nMOS transistor N2 with one current path end connected to the inverted bit line /BL and a gate connected to the bit line BL. The other end of the current path of each of the nMOS transistors N1 and N2 is connected to a activating node SAN.

The activating node of the n-type sense amplifier 11 SAN is connected to the intermediate voltage Vcc/2 via a switch SW1N and the low voltage Vss via a switch SW2N.

The p-type sense amplifier 12 comprises a p-channel MOSFET (to be referred to as a PMOS transistor hereinafter) P1 with one current path end connected to the bit line BL and a gate connected to the inverted bit line /BL, and a pMOS transistor P2 with one current path end connected to the inverted bit line /BL and a gate connected to the bit line BL. The other end of the current path of each of the pMOS transistors P1 and P2 is connected to a activating node SAP.

The activating node of the p-type sense amplifier 12 SAP is connected to the intermediate voltage Vcc/2 via a switch SW1P and the high voltage Vcc via a switch SW2P.

The operation will be explained.

As shown in FIG. 19, the word line WL1 is at the low voltage Vss during the standby period (precharge period). The switches SW1N and SW1P are ON, and the switches SW2N and SW2P are OFF. With this setting, the activating nodes SAN and SAP are at the intermediate voltage Vcc/2. The precharge signal PRC is at the high voltage Vcc. The voltages of the pair of bit lines BL and /BL are equalized to the intermediate voltage Vcc/2.

After the precharge period, the read/write period (active period) starts. When the precharge period shifts to the read/write period, the precharge signal PRC first changes to the low voltage Vss. The switches SW1N and SW1P are turned off, and the activating nodes SAN and SAP are disconnected from the intermediate voltage Vcc/2. If the word line WL1 of all word lines is selected, its voltage rises to an active voltage of the word line VWLH higher than the high voltage Vcc. Data corresponding to the storage charge amount is previously written and stored in the storage node electrode SN1 of the memory cell MC1. During a read period, the voltage of the word line WL1 rises to the voltage VWLH to turn on the transfer gate transistor TR1 of the memory cell MC1, and the electrical charge written in the storage node electrode SN1 is transmitted to the bit line BL. As a result, the voltage of the bit line BL slightly changes. When data "1" is written in the storage node electrode SN1, the voltage of the bit line BL rises by $+\Delta V$; when data "0" is written in the storage node electrode SN1, the voltage of the bit line BL falls by $-\Delta V$. FIG. 19 exemplifies the case wherein the voltage rises by $+\Delta V$. The voltage $\Delta V$ and a memory capacitor CS/bit line capacitor CB have a relationship of $\Delta V=(CS/CB)\times(Vcc/2)$.

After the data of the memory cell is transferred to the bit line, the switches SW2N and SW2P are turned on. Then, the activating node SAN is connected to the low voltage Vss, and the activating node SAP is connected to the high voltage Vcc. The sense amplifiers 11 and 12 are activated. The voltage of the bit line BL further rises from $(Vcc/2)+\Delta V$ to the high voltage Vcc, whereas the voltage of the inverted bit line /BL falls from Vcc/2 to the low voltage Vss, thereby amplifying the potential difference between the pair of bit lines. The amplified potential difference between the pair of bit lines is transmitted as readout data to a data line (not shown). In addition, the potential difference between the pair of bit lines is latched by the sense amplifiers 11 and 12 while they are activated. Using the latched voltage Vcc of the bit line BL as data to be restored in the memory cell MC1, data "1" is restored in the memory cell MC1.

The principle of voltage amplification by the sense amplifier will be described with reference to the n-type sense amplifier 11 (nMOS transistors N1 and N2 and activating node SAN) shown in FIG. 18 for the sake of simplicity.

FIGS. 20A and 20B are views for explaining the principle of voltage amplification. FIG. 20A is a view showing a state before the sense amplifier is activated, and FIG. 20B is a view showing a state during activation of the sense amplifier.

As shown in FIG. 20A, before the n-type sense amplifier 11 is activated, the bit line BL is at a voltage of $(Vcc/2)+\Delta V$, the inverted bit line /BL is at the voltage Vcc/2, and the activating node SAN is at the potential Vcc/2.

Thereafter, as shown in FIG. 20B, the voltage of the activating node SAN decreases to Vss, and the n-type sense amplifier 11 is activated. After the voltage of the activating node SAN decreases to Vss, the voltage (corresponding to the amount of charges) of the bit line BL tends to be decreased to the low voltage Vss as BL is discharged toward Vss via the nMOS transistor N1. Similarly, the voltage (corresponding to the amount of charges) of the inverted bit line /BL tends to be decreased to the low voltage Vss as /BL is discharged toward Vss via the nMOS transistor N2. As for the nMOS transistor N2, a source S2 is at the voltage Vss, and a gate G2 is at the voltage of $(Vcc/2)+\Delta V$. As for the nMOS transistor N1, a source S1 is at the voltage Vss, and a gate G1 is at the voltage Vcc/2. In other words, a potential difference VGS between the gate and source of the nMOS transistor N2 is larger than that of the nMOS transistor N1. In this state, the nMOS transistor N2 has a higher current activating ability than that of the nMOS transistor N1. Therefore, the voltage (corresponding to the amount of charges) of the inverted bit line /BL is decreased to the low voltage Vss as /BL is discharged toward Vss via the NMOS transistor N2 prior to the voltage (corresponding to the amount of charges) of the bit line BL. The decrease in voltage of the inverted bit line /BL decreases the voltage of the gate G1 of the NMOS transistor N1. The current activating ability of the nMOS transistor N1 starts lowering. As the current activating ability of the NMOS transistor N1 lowers, the difference in current activating ability between the nMOS transistor N2 and the nMOS transistor N1 is increased more and more. As a result, the voltage of the inverted bit line /BL comes close to the low voltage Vss quickly than that of the bit line BL.

Also in the p-type sense amplifier 12, the voltage of the bit line BL comes close to the high voltage Vcc faster than that of the inverted bit line /BL in accordance with an operation principle symmetrical to that of the n-type sense amplifier 11.

When the voltage of the bit line BL reaches Vcc, and that of the inverted bit line /BL reaches Vss, charging of the bit line BL from the activating node SAP and discharging of the inverted bit line /BL to the activating node SAN stop.

The principle of voltage amplification by the sense amplifier has been described above.

In the typical sense amplifier, if the power supply voltage Vcc decreases to, e.g., 1 to 1.5V, the voltage VGS $(=(Vcc/2)-Vss)$ across the gate and source of each of the nMOS transistors N1 and N2 decreases, resulting in lower current activating abilities of the nMOS transistors N1 and N2 than the conventional case. This delays the voltage amplification operation of the sense amplifier.

If the power supply voltage Vcc further decreases to 1V or less, the nMOS transistors N1 and N2 may not operate satisfactorily because the threshold voltages of the nMOS transistors N1 and N2 become higher than the voltage VGS across the gate and source. In this state, even if the voltage of the activating node SAN is connected to Vss, only a voltage VDS across the source and drain of each of the nMOS transistors N1 and N2 changes to $(Vcc/2)+\Delta V$ or Vcc/2, so the inverted bit line /BL cannot be effectively discharged to the activating node SAN. Therefore, the voltage amplification speed of the sense amplifier further decreases.

To solve this problem, the threshold voltages of the nMOS transistors N1 and N2 suffice to be set low. In general, however, they must be 0.4 to 0.5V or more because lower threshold voltages of the nMOS transistors N1 and N2 generate a subthreshold leak current between the high voltage Vcc and the low voltage Vss in the sense amplifier made up of the n-type sense amplifier 11 and the p-type sense amplifier 12, i.e., of the CMOS circuit. Moreover, a similar subthreshold leak current is generated in a peripheral circuit using an nMOS transistor formed in the same manufacturing process as the nMOS transistors N1 and N2. As is well known, the subthreshold leak current increases the power consumption.

A sense amplifier for solving the problem caused by an ultra-low power supply voltage Vcc is reported in M. Nakamura et al. "A 29 ns 64 Mb DRAM with Hierarchical Array Architecture", ISSCC 95. In the sense amplifier reported in this reference, the activating node SAP is temporarily connected to a voltage Vcc2 higher than the memory cell data "1", i.e., the high voltage Vcc to increase the voltage VGS across the gate and source of each of the pMOS transistors P1 and P2 of a p-type sense amplifier at the start of activating the sense amplifier.

The principle of voltage amplification by this sense amplifier will be briefly described in correspondence with the sense amplifier shown in FIGS. 18 and 19.

FIG. 21 is a circuit diagram of a conventional bit line sense amplifier of a DRAM and its peripheral circuit. FIG. 22 is an operation waveform chart of the sense amplifier. The same reference numerals as in FIGS. 18 and 19 denote the same parts in FIGS. 21 and 22, and only a difference will be explained.

As shown in FIG. 21, the circuit is different from that shown in FIG. 18 in that the activating node SAP is connected via a switch SW3P to the voltage Vcc2 higher than the high voltage Vcc.

The operation will be explained below.

As shown in FIG. 22, the word line WL1 is at the low voltage Vss during the precharge period. The switches SW1N and SW1P are ON, and the switches SW2N, SW2P, and SW3P are OFF. With this setting, the activating nodes SAN and SAP are at the intermediate voltage Vcc/2.

After the precharge period, the read/write period (active period) starts. When the precharge period shifts to the read/write period, the precharge signal PRC first changes to the low voltage Vss. The switches SW1N and SW1P are turned off, and the activating nodes SAN and SAP are disconnected from the intermediate voltage Vcc/2. After that, the word line WL1 is selected, and its voltage increases to an active voltage of the word line VWLH higher than the high voltage Vcc. Data written in the storage node electrode SN1 is transferred to the bit line BL, and the voltage of the bit line BL slightly changes within the range of ±ΔV. FIG. 22 exemplifies the case wherein the voltage rises by +ΔV. Upon the slight change in voltage of the bit line BL, the switch SW3P is turned on to connect the activating node SAP to the sufficiently high voltage Vcc2. At this time, the difference between the voltage Vcc/2 of the inverted bit line /BL and the voltage Vcc2 of the activating node SAP becomes more than the voltage Vcc/2. The potential difference VGS=Vcc2−(Vcc/2) between the gate and source of the PMOS transistor P1 becomes more than the threshold voltage of the PMOS transistor P1, and the p-type sense amplifier 12 starts satisfactorily amplifying the voltage. The p-type sense amplifier 12 starts charging the bit line BL to the sufficiently high voltage Vcc2 via the pMOS transistor P1 prior to the inverted bit line /BL in accordance with the principle of voltage amplification described above. Accordingly, the voltage of the bit line BL rises. By the raised voltage of the bit line BL, the potential difference between the gate and source of the nMOS transistor N2 exceeds the threshold voltage of the nMOS transistor N2. Then, the n-type sense amplifier 11 starts satisfactorily amplifying the voltage. The n-type sense amplifier 11 discharges the inverted bit line /BL to the low voltage Vss via the nMOS transistor N2 prior to the bit line BL in accordance with the principle of voltage amplification described above. After the potential difference between the pair of bit lines is satisfactorily amplified in this manner, the switch SW3P is turned off, and the switch SW2P is turned on, thereby decreasing the voltage Vcc2 of the bit line BL to the high voltage Vcc. Using the latched high voltage Vcc of the bit line BL as data to be restored in the memory cell MC1, data "1" is restored in the memory cell MC1.

In this sense amplifier, at the start of activating the sense amplifier, the activating node SAP is increased to the sufficiently high voltage Vcc2 to drive the p-type sense amplifier 12 first and to raise the voltage of the bit line BL. Using the raised voltage of the bit line BL, the n-type sense amplifier 11 is activated.

By this method, the potential difference between the pair of bit lines can be amplified by the sense amplifier even when the power supply voltage Vcc is decreased to twice or less the threshold voltage of the nMOS transistors N1 and N2.

However, in the bit line sense amplifier with an ultra-low operation voltage which can be used in a semiconductor memory wherein the p-type sense amplifier is first operated, the following technical difficulty is found: the operation margin is smaller than that of a typical sense amplifier not having three power sources for p-type sense amplifier such as shown in FIG. 21.

By the conventional semiconductor manufacturing technique, the threshold voltage in the whole chip or whole wafer varies more in the pMOS transistor whose threshold is difficult to control to be an uniform value than in the nMOS transistor.

In the sense amplifier (FIG. 21) which operates at an ultra-low voltage, the p-type sense amplifier 12 is operated prior to the n-type sense amplifier 11 in order to raise the bit line voltage. In other words, the pMOS transistor whose threshold voltage varies over a wide range performs the initial operation of voltage amplification.

During operation of the sense amplifier, the sense amplifier may erroneously operate if two, paired transistors are different in threshold voltage owing to manufacturing conditions. More specifically, as described above, according to the operation principle of the sense amplifier, the charges of the memory cell are transferred to the bit lines to amplify a small potential difference between the pair of bit lines by the difference between two activating abilities with gate electrodes connected to the bit lines. If the threshold voltage varies to be higher than the slight signal voltage, the signal cannot be accurately amplified, decreasing the operation margin. Therefore, to ensure the operation margin, the signal voltage must be sufficiently set higher than variations in threshold voltage of the transistor caused during the manufacture.

In a conventional sense amplifier which can operate at an ultra-low voltage and performs the initial operation of voltage amplification by a pMOS sense amplifier whose threshold voltage varies over a wide range, a signal voltage in the bit line must be set lower in order to ensure the same operation margin with respect to variations in power supply voltage or the use environment such as the temperature as in a sense amplifier which performs the initial operation of voltage amplification by an nMOS sense amplifier. For example, the lowest power supply voltage is set higher, or the capacitance of the cell capacitor is set larger. A high power supply voltage however contradicts the object of decreasing the operation voltage. To increase the capacitance of the cell capacitor, the semiconductor manufacturing process must be improved.

BRIEF SUMMARY OF THE INVENTION

Accordingly, it is an object of the present invention to provide a semiconductor integrated circuit device having a memory function and a sense amplifier which can operate at a low voltage and can ensure a satisfactory operation margin.

According to the present invention, there is provided a semiconductor integrated circuit device comprising a plurality of word lines; a plurality of bit lines; a plurality of memory cells each having a capacitor capable of storing data having one of at least two voltages, and a transfer gate transistor for controlling connection between the capacitor and the bit line in accordance with a voltage of the word line; an n-type sense amplifier having a first n-channel FET with a drain connected to a first bit line of the plurality of bit lines and a gate connected to a second bit line, and a second n-channel FET with a drain connected to the second bit line and a gate connected to the first bit line; an n-type sense amplifier driver for applying an n-type sense amplifier activating voltage to sources of the first and second n-channel FETS; and a sense amplifier controller for setting the n-type sense amplifier activating voltage applied by the n-type sense amplifier driver to a first voltage lower than the lowest voltage of data stored in the capacitor in activating the n-type sense amplifier, and setting the n-type sense amplifier activating voltage applied by the n-type sense amplifier driver to a second voltage substantially equal to the lowest voltage of data stored in the capacitor in restoring data in the capacitor of the memory cell.

According to the present invention, a semiconductor memory device having a memory function and a sense amplifier which can operate at a low voltage and can ensure a satisfactory operation margin can be provided.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a semiconductor integrated circuit device according to the present invention will now be described with reference to the accompanying drawings.

First embodiment

Figure 1:
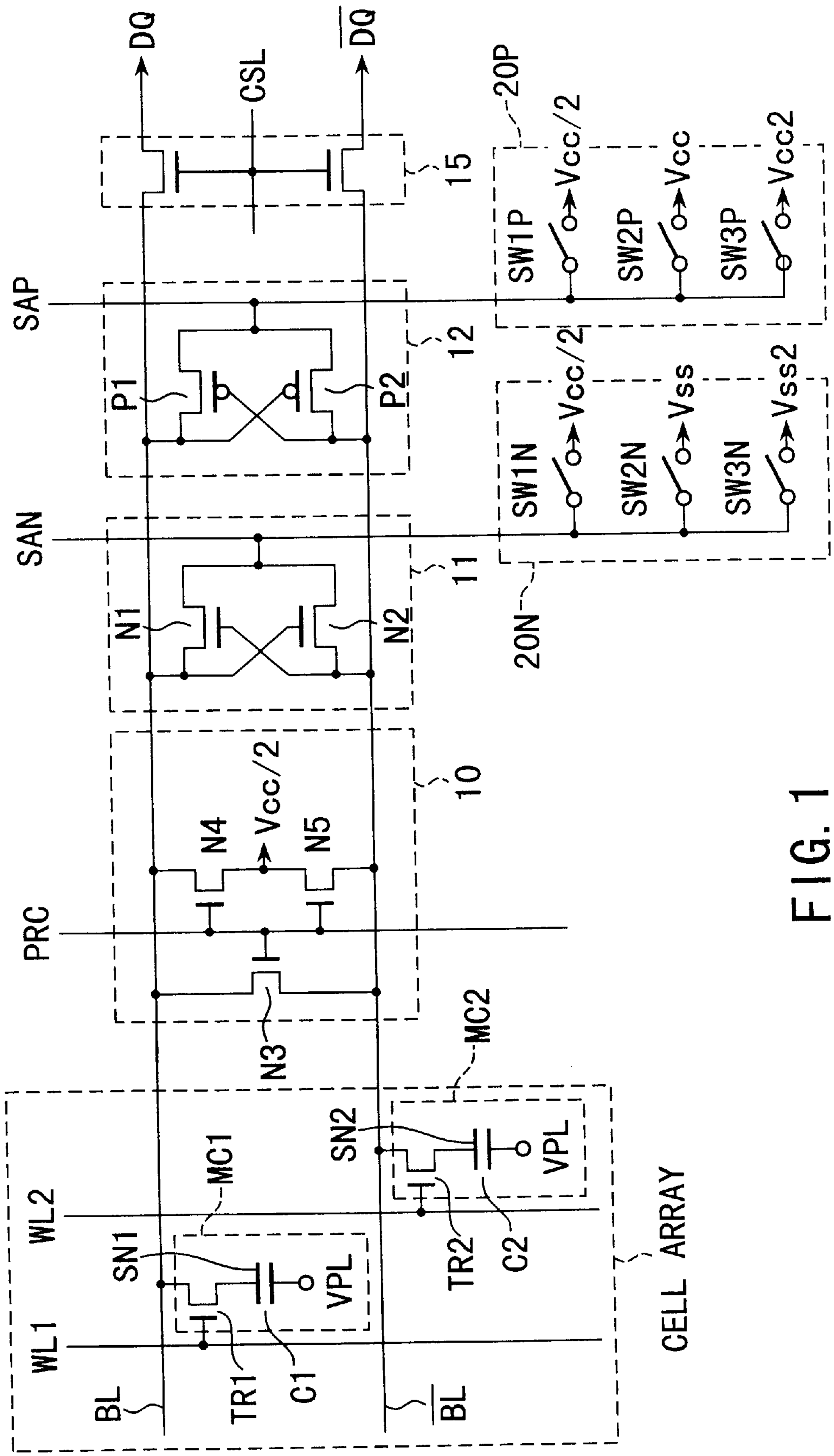
FIG. 1 is a circuit diagram of a sense amplifier according to a first embodiment of the present invention.
Figure 2:
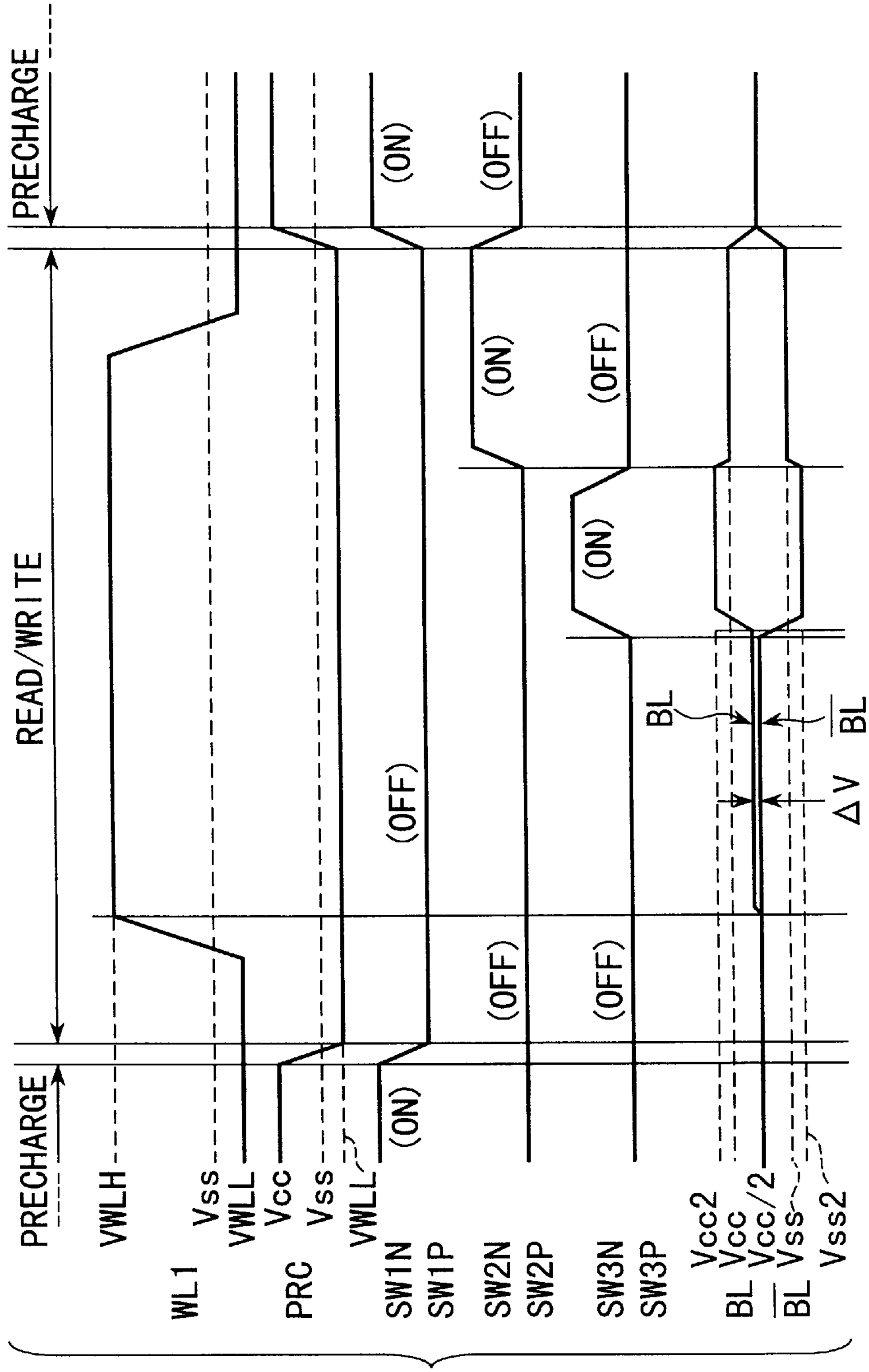
FIG. 2 is an operation waveform chart of the sense amplifier according to the first embodiment of the present invention.
Figure 3:
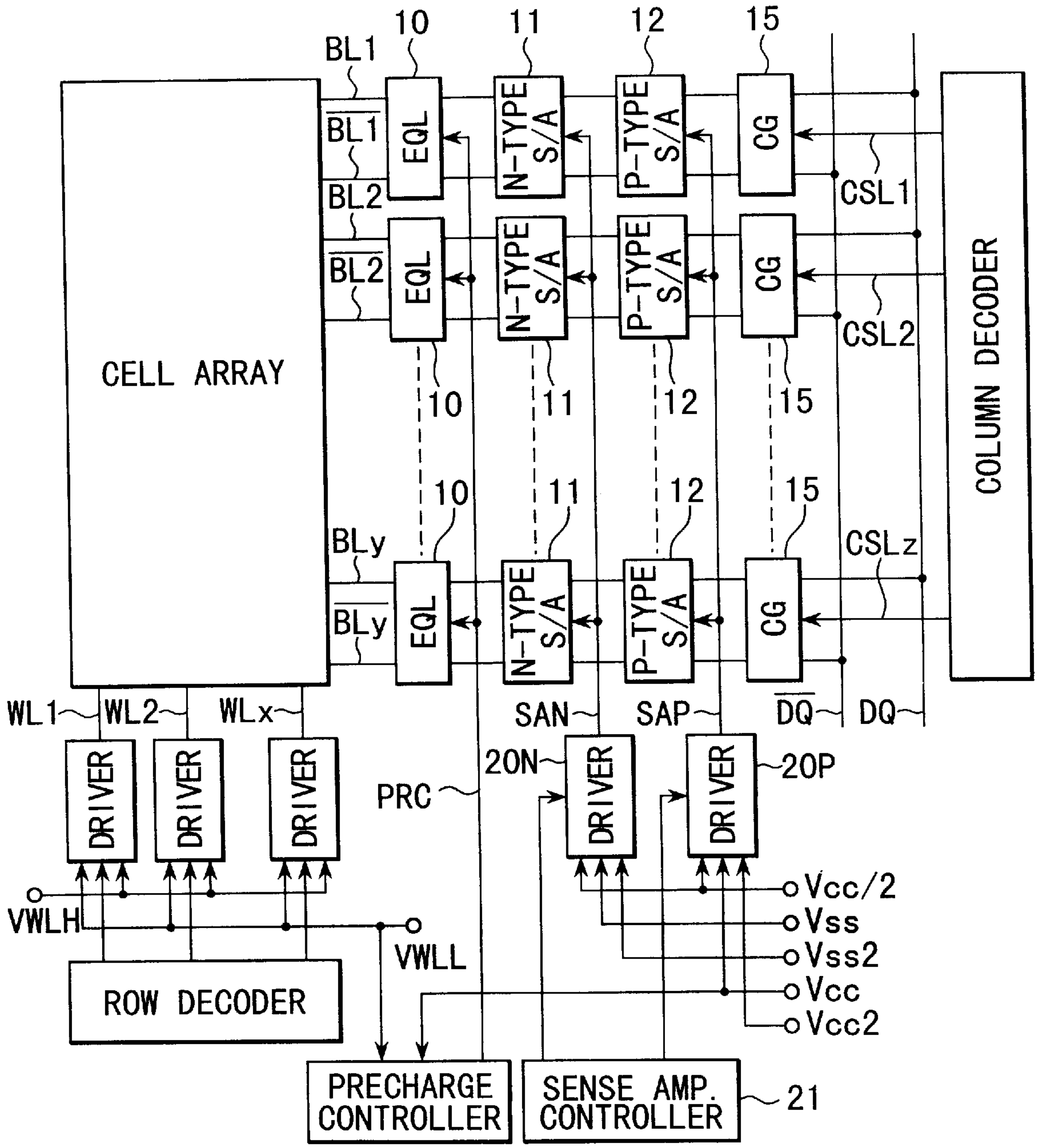
FIG. 3 is a block diagram of a DRAM having the sense amplifier according to the first embodiment of the present invention.

FIG. 1 is a circuit diagram of a bit line sense amplifier of a DRAM according to the first embodiment of the present invention. FIG. 2 is an operation waveform chart. FIG. 3 is a block diagram of the DRAM having the bit line sense amplifier shown in FIG. 1.

As shown in FIG. 1, a plurality of word lines WL (WL1 and WL2) and a plurality of bit lines BL (BL and /BL) are formed in a cell array. At respective electrical intersections of the word lines WL and the bit lines BL, dynamic memory cells MC (MC1 and MC2) are formed.

The memory cell MC1 comprises a transfer gate transistor TR1 and a memory capacitor C1. The transfer gate transistor TR1 has a current path and a gate electrode connected to a word line WL1. One end of the current path is connected to the bit line BL. Two electrodes of the memory capacitor C1 are connected to the other end of current path of the transfer gate transistor TR1 and a plate electrode, respectively. The electrical charge of memory data is stored at a contact node of the TR1 and C1 (a storage node). The plate electrode receives a plate voltage VPL. Similarly, the memory cell MC2 comprises a transfer gate transistor TR2 and a memory capacitor C2. The transfer gate transistor TR2 has a current path and a gate electrode connected to a word line WL2. One end of the current path is connected to the inverted bit line /BL. Two electrodes of the memory capacitor C2 are connected to the other end of current path of the transfer gate transistor TR1 and a plate electrode, respectively. The electrical charge of memory data is stored at a contact node of the TR2 and C2 (a storage node). The plate electrode receives the plate voltage VPL. The inverted bit line /BL and the bit line BL are paired (to be referred to as a pair of bit lines hereinafter).

The pair of bit lines BL and /BL are led outside, e.g., the cell array and connected to a bit line system circuit (column system circuit) outside the cell array. In the first embodiment, the bit line system circuit includes a bit line pair equalizer 10 for equalizing the potential difference between the pair of bit lines BL and /BL, n-type and p-type sense amplifiers 11 and 12 for amplifying the memory data of the memory cell MC read out as a small potential difference between the pair of bit lines BL and /BL, and a column gate 15 for connecting the pair of bit lines BL and /BL designated for a read to a pair of data lines DQ and /DQ.

The equalizer 10 comprises an n-channel MOSFET N3 (to be referred to as an nMOS transistor hereinafter) with a current path series-connected between the bit line BL and the inverted bit line /BL, an nMOS transistor N4 which has one current path end connected to the bit line BL and receives, at the other end, an intermediate voltage Vcc/2 between a high voltage Vcc and a ground voltage Vss, and an nMOS transistor N5 which has one current path end connected to the inverted bit line /BL and receives the intermediate voltage at the other end. The gates of the nMOS transistors N3 to N5 receive a precharge signal PRC.

The n-type sense amplifier 11 comprises an nMOS transistor N1 with a drain connected to the bit line BL and a gate connected to the inverted bit line /BL, and an nMOS transistor N2 with a drain connected to the inverted bit line /BL and a gate connected to the bit line BL. The sources of the nMOS transistors N1 and N2 are connected to a control signal line (activating node) SAN.

The activating node SAN is applied with a voltage by an n-type sense amplifier driver 20N. The driver 20N comprises switches SW1N, SW2N, and SW3N. The switch SW1N connects the control signal line SAN to an intermediate voltage between power supply voltages (Vss and Vcc). In the first embodiment, the intermediate voltage is set to about half the voltage Vcc, i.e., the voltage Vcc/2. The switch SW2N connects the control signal line SAN to a lower one of the power supply voltages. In the first embodiment, the lower voltage is the ground voltage Vss. The switch SW3N connects the control signal line SAN to, e.g., a negative voltage Vss2 lower than the ground voltage Vss.

The p-type sense amplifier 12 comprises a pMOS transistor P1 with a drain connected to the bit line BL and a gate connected to the inverted bit line /BL, and a pMOS transistor P2 with a drain connected to the inverted bit line /BL and a gate connected to the bit line BL. The sources of the PMOS transistors P1 and P2 are connected to a control signal line (activating node) SAP.

The control signal line SAP is applied with a voltage by a p-type sense driver 20P. The driver 20P comprises switches SW1P, SW2P, and SW3P. The switch SW1P connects the control signal line SAP to an intermediate voltage between the power supply voltages (Vss and Vcc). In the first embodiment, the intermediate voltage is the voltage Vcc/2. The switch SW2P connects the control signal line SAP to a higher one of the power supply voltages. In the first embodiment, the higher voltage is the high voltage Vcc applied externally. The switch SW3P connects the control signal line SAP to a voltage Vcc2 higher than the high voltage Vcc.

The switches SW1N to SW3N and SW1P to SW3P are turned on/off by a sense amplifier controller 21 shown in FIG. 3.

The operation will be described below.

As shown in FIG. 2, during the precharge period, the word line WL1 is at an inactive voltage of the word line VWLL lower than the ground voltage Vss in order to decrease a leakage current flowing through the transfer gate transistor TR (TR1 or TR2). The switches SW1N and SW1P are ON, and the switches SW2N, SW2P, SW3N, and SW3P are OFF. With this setting, the control signal lines SAN and SAP are at the intermediate voltage Vcc/2. The precharge signal PRC is at the high voltage Vcc. The voltages of the pair of bit lines BL and /BL are equalized to the intermediate voltage Vcc/2.

After the standby period, the read/write period (active period) starts. When the standby period shifts to the read/write period, the precharge signal PRC first changes to a voltage lower than the ground voltage Vss. In the first embodiment, the precharge signal PRC changes to the inactive voltage of the word line VWLL in order to decrease a leakage current flowing through the nMOS transistors N3, N4, and N5. The switches SW1N and SW1P turn off, and the control signal lines SAN and SAP are disconnected from the intermediate voltage Vcc/2. If the word line WL1 of all word lines is selected, the selected word line WL1 is applied with the active voltage of the word line VWLH higher than the high voltage Vcc (in order to write data "H", i.e., the voltage Vcc in the capacitor C (C1 or C2) without threshold leakage). Data corresponding to the storage charge amount is previously written in the storage node electrode SN1 of the memory cell MC1. The voltage of the word line WL1 rises to the voltage VWLH to turn on the transfer gate transistor TR1. The data written in the storage node electrode SN1, i.e., a data charge is transmitted to the bit line BL. Then, the voltage of the bit line BL slightly changes. When data "1" is written in the storage node electrode SN1, the voltage of the bit line BL rises by $+\Delta V$; when data "0" is written, the voltage of the bit line BL falls by $-\Delta V$. FIG. 2 exemplifies the case wherein the voltage rises by $+\Delta V$.

The switches SW3N and SW3P are turned on. The control signal line SAN is connected to the voltage Vss2 sufficiently lower than the ground voltage Vss, and the control signal line SAP is connected to the voltage Vcc2 sufficiently higher than the high voltage Vcc.

Figure 4:
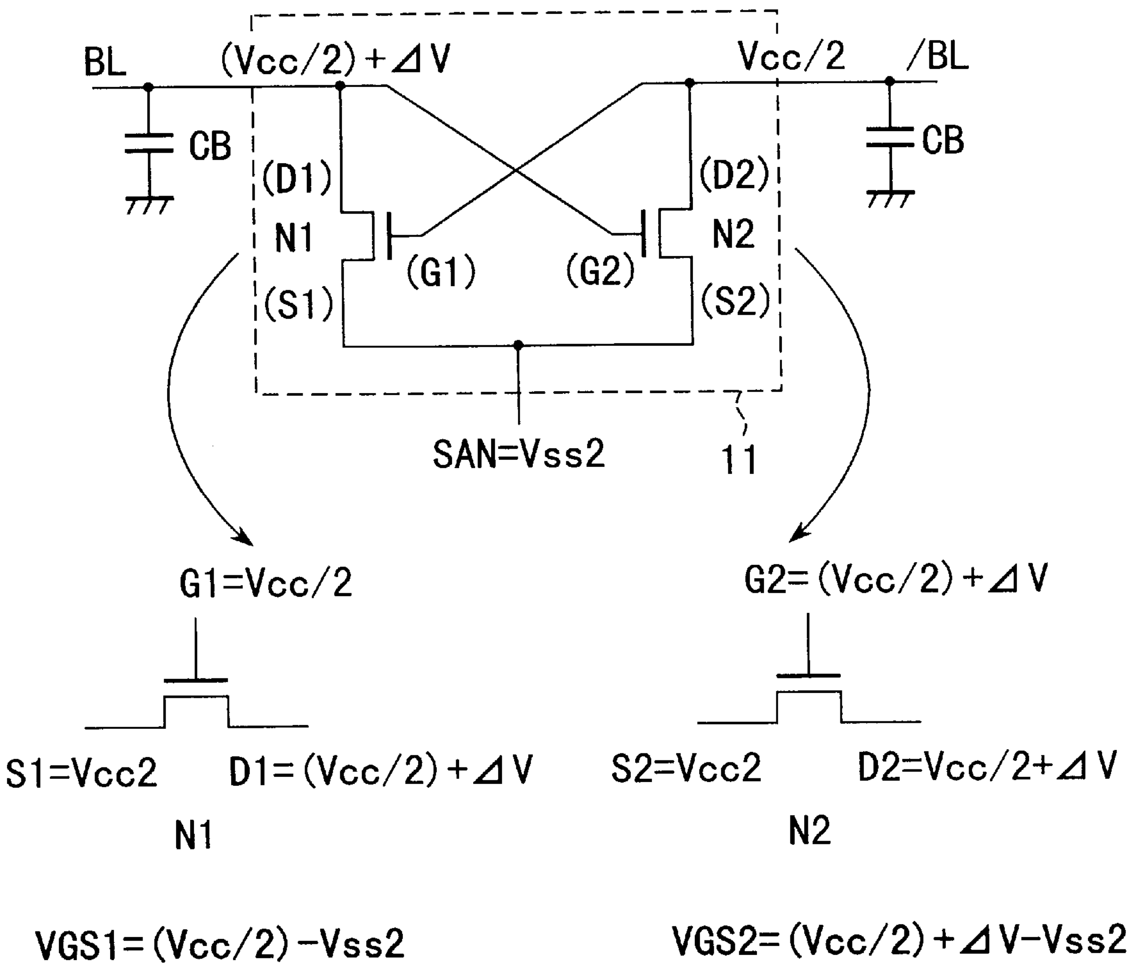
FIG. 4 is a circuit diagram for explaining the amplification principle of the sense amplifier in the first embodiment.
Figure 18:
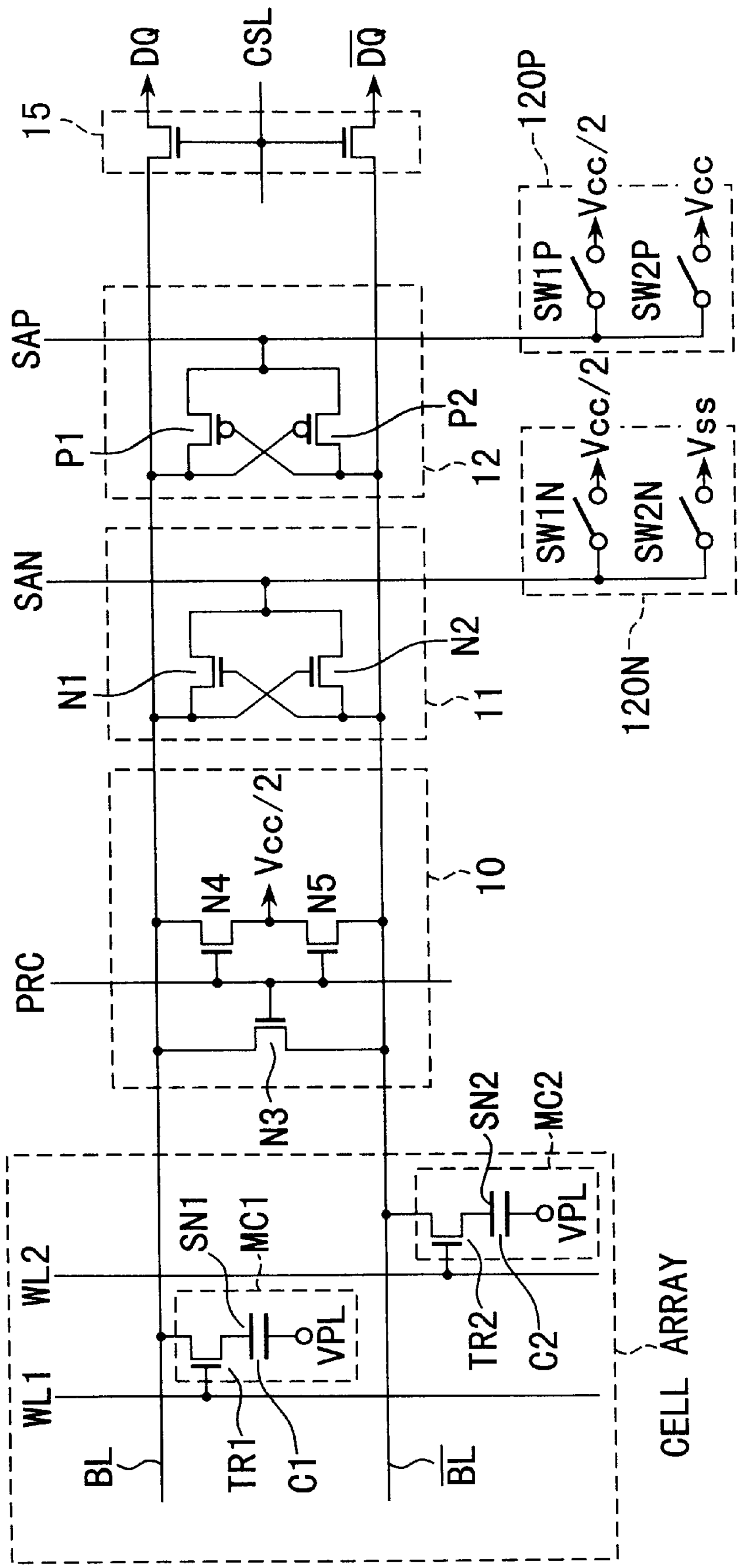
FIG. 18 is a circuit diagram of a conventional sense amplifier.
Figure 19:
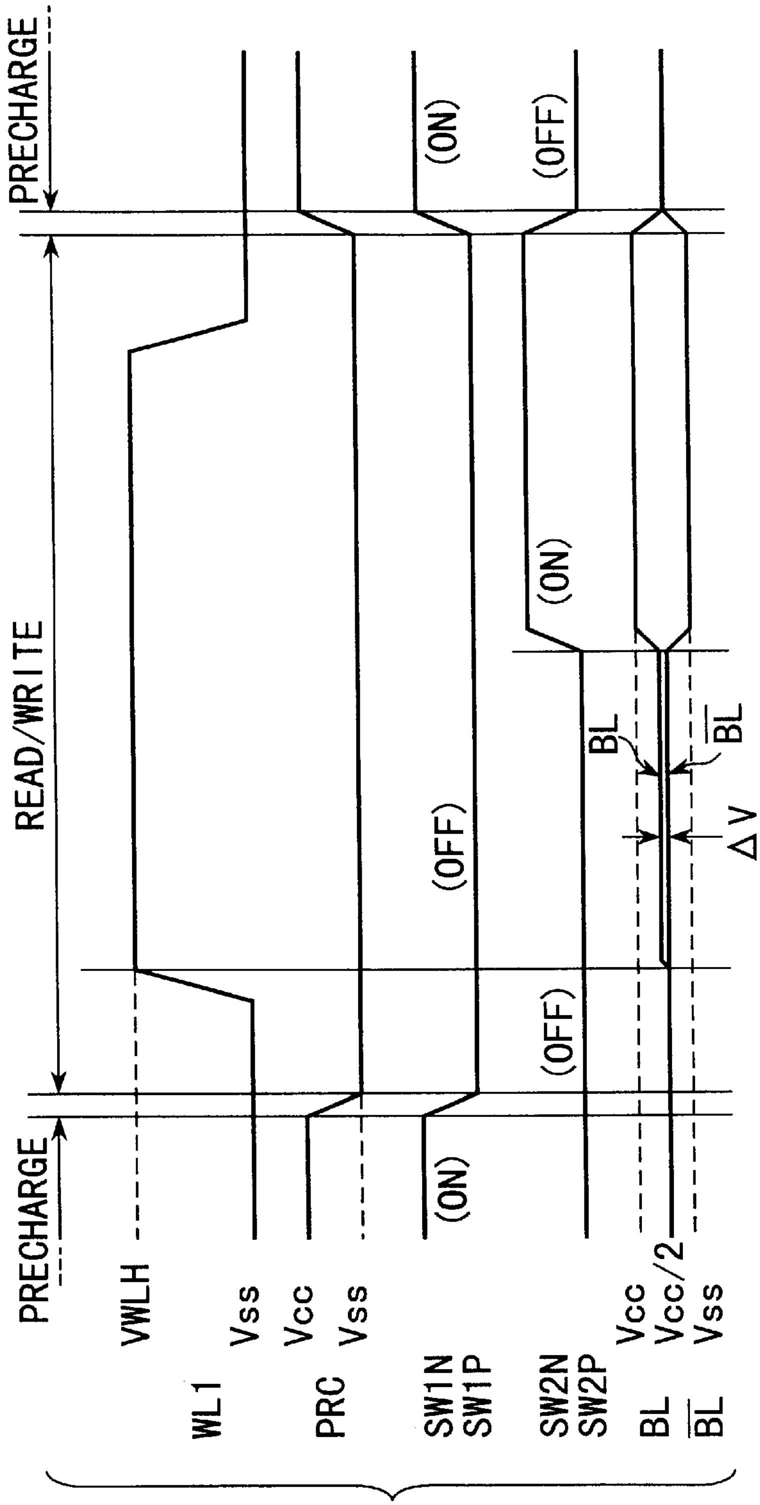
FIG. 19 is an operation waveform chart of the conventional sense amplifier.
Figure 20A:
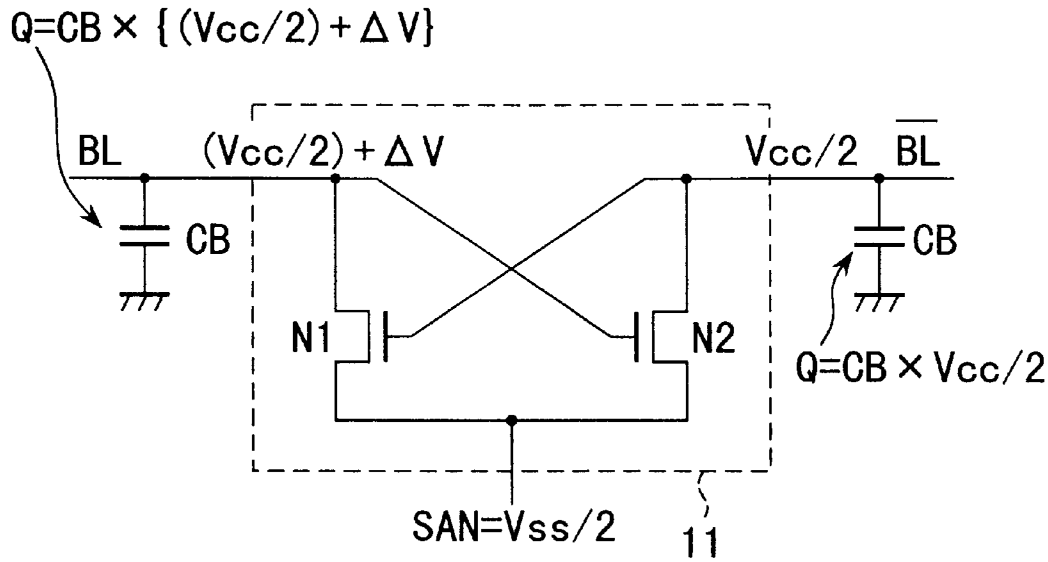
FIGS. 20A and 20B are views, respectively, for explaining the amplification principle of the sense amplifier.
Figure 20B:
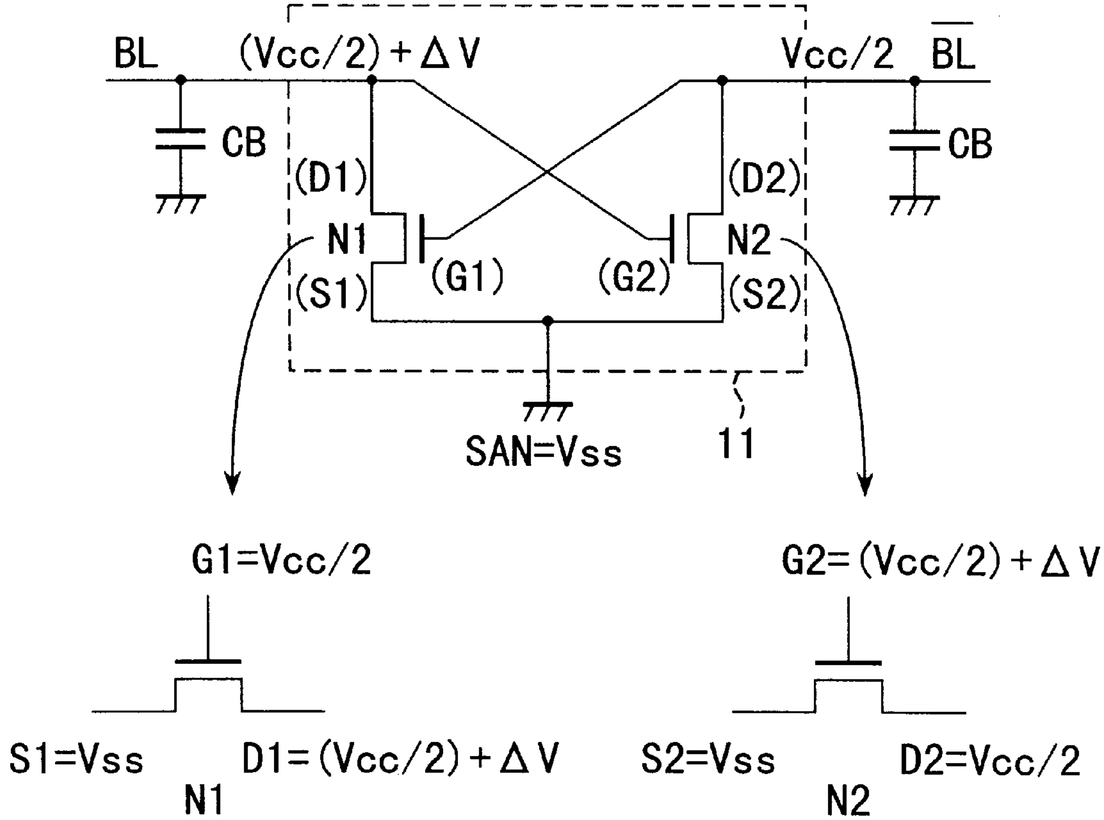

At this time, a potential difference VGS1 of (Vcc/2)−Vss2 is applied across the gate and source of the nMOS transistor N1, while a potential difference VGS2 of $(Vcc/2)+\Delta V-Vss2$ is applied across the gate and source of the nMOS transistor N2. FIG. 4 shows this state. The voltage Vss2 is lower than the ground potential Vss (=0V). Therefore, the potential differences VGS1 and VGS2 between the gates and sources of the NMOS transistors N1 and N2 become larger than those in the conventional sense amplifier shown in FIGS. 18 and 21. More specifically, the nMOS transistors N1 and N2 can satisfactorily operate by setting the differences VGS1 and VGS2 more than the threshold voltages of the nMOS transistors N1 and N2, e.g., 0.4 to 0.5V. According to the principle of voltage amplification, the voltage (corresponding to the amount of charges) of the inverted bit line /BL decreases from the voltage Vcc/2 to the sufficiently lower voltage Vss2 as /BL is discharged via the nMOS transistor N2.

Since the voltage Vss2 is lower than the ground voltage Vss, the n-type sense amplifier 11 can amplify the voltage even if the power supply voltage Vcc is greatly decreased such that the difference between the ground voltage Vss and the precharge voltage Vcc/2 becomes smaller than the thresholds of the nMOS transistors N1 and N2. To operate the n-type sense amplifier 11 in this state, the voltage Vss2 must be so low as to increase the voltage difference between the sources and gates of the nMOS transistors N1 and N2 to be larger than the thresholds of the transistors N1 and N2. For example, letting VTH be the threshold of the nMOS transistor, $$VGS1=(Vcc/2)-Vss2>VTH$$

$$VGS2=(Vcc/2)+\Delta V-Vss2>VTH$$

Therefore, the n-type sense amplifier 11 of the first embodiment can operate by setting the voltage Vss2 lower than (Vcc/2)−VTH.

A potential difference of Vcc2−(Vcc/2) is applied across the gate and source of the pMOS transistor P1, whereas a potential difference of Vcc2−(Vcc/2)+ΔV is applied across the gate and source of the PMOS transistor P2. The voltage Vcc2 is higher than the power source voltage Vcc. Therefore, similar to the nMOS transistors N1 and N2, the gates and sources of the pMOS transistors P1 and P2 have larger potential differences than those in the conventional sense amplifier. By keeping these potential differences larger than the threshold voltages of the pMOS transistors P1 and P2, the pMOS transistors P1 and P2 satisfactorily operate, similar to the nMOS transistors N1 and N2. With this setting, the voltage of the bit line BL decreases from a voltage of Vcc/2+ΔV to the sufficiently high voltage Vcc2 via the pMOS transistor P1.

A potential difference of Vcc2−Vss2 between the pair of bit lines BL and /BL that is satisfactorily amplified in the above manner is read out to the pair of data lines DQ and /DQ upon turning on the column gate 15.

Thereafter, the switches SW3N and SW3P are turned off, and the switches SW2N and SW2P are turned on. The voltage of the bit line BL changes from the sufficiently high voltage Vcc2 to the high voltage Vcc. The voltage of the inverted bit line /BL changes from the sufficiently low voltage Vss2 to the ground voltage Vss. While the sense amplifiers 11 and 12 are activated, the voltage Vcc of the bit line BL and the voltage Vss of the inverted bit line /BL are respectively latched by the sense amplifiers 11 and 12. Using the latched voltage Vcc of the bit line BL as data to be restored in the memory cell MC1, data "1" is restored in the memory cell MC1.

When data "0" is read out from the memory cell MC1, the voltage of the bit line BL is latched to the voltage Vss by the sense amplifiers 11 and 12. Using the voltage Vss of the bit line BL as data to be restored in the memory cell MC1, data "0" is restored in the memory cell MC1.

After the readout data is restored in the memory cell MC1, the voltage of the word line WL1 changes to the inactive voltage of the word line VWLL. The precharge signal PRC changes to the high voltage Vcc, the switches SW2N and SW2P are turned off, the switches SW1N and SW1P are turned on, and the read/write period returns to the standby period again.

As described above, in the sense amplifier according to the first embodiment, the voltage Vss2 sufficiently lower than the ground voltage Vss is applied to the sources of the nMOS transistors N1 and N2 in amplifying a small potential difference between the pair of bit lines BL and /BL. By lowering the voltage of the control signal line SAN for activating the n-type sense amplifier 11 in this way, the n-type sense amplifier 11 can amplify the voltage even if the power supply voltage Vcc is greatly decreased such that the difference between the ground voltage Vss and the precharge voltage Vcc/2 becomes smaller than the threshold voltages of the nMOS transistors N1 and N2. The potential difference further increases by operating the p-type sense amplifier 12 after the n-type sense amplifier 11 operates to increase the potential difference between the pair of bit lines.

Figure 21:
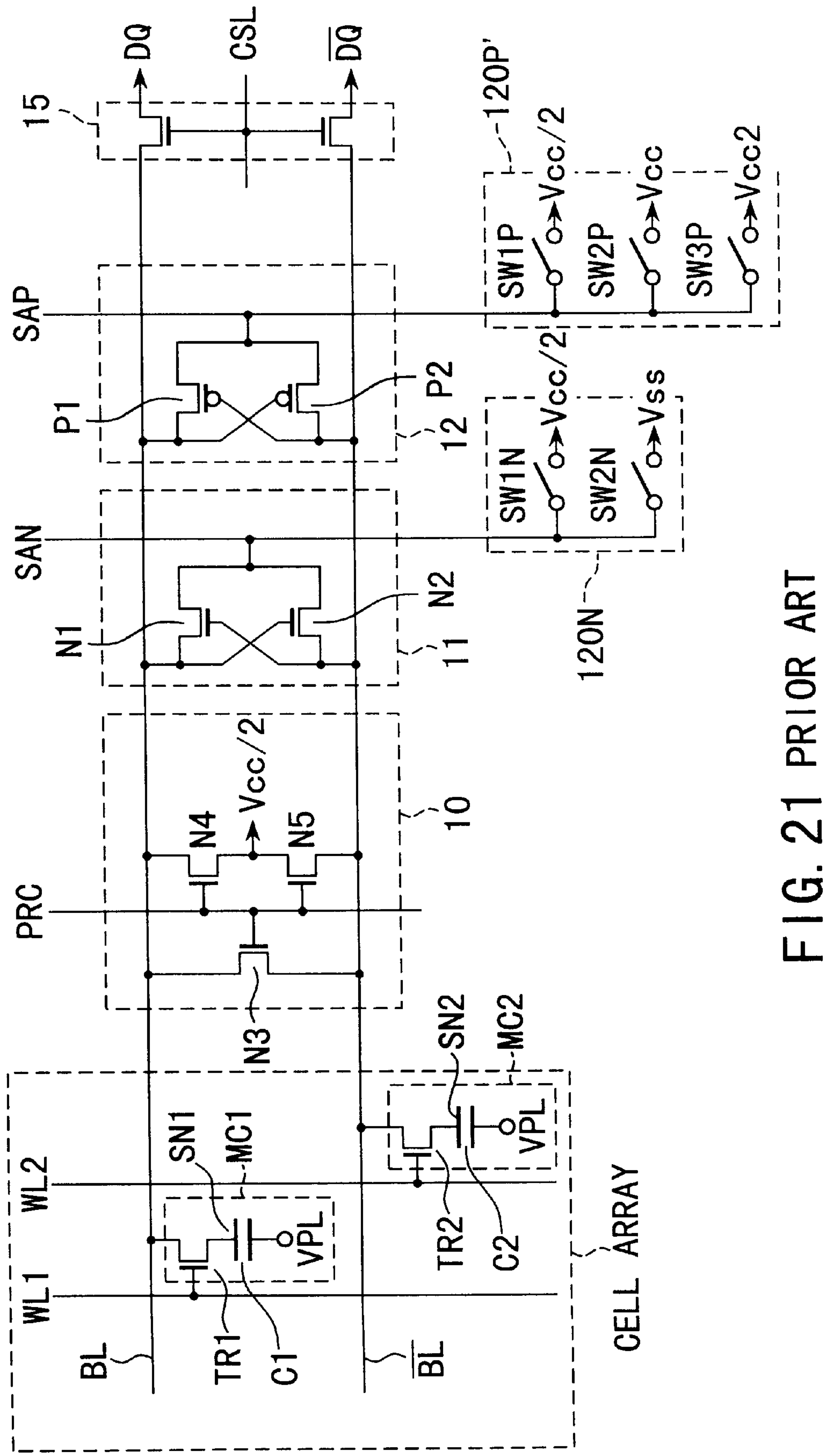
FIG. 21 is a circuit diagram of a conventional ultra-low-voltage operation sense amplifier.
Figure 22:
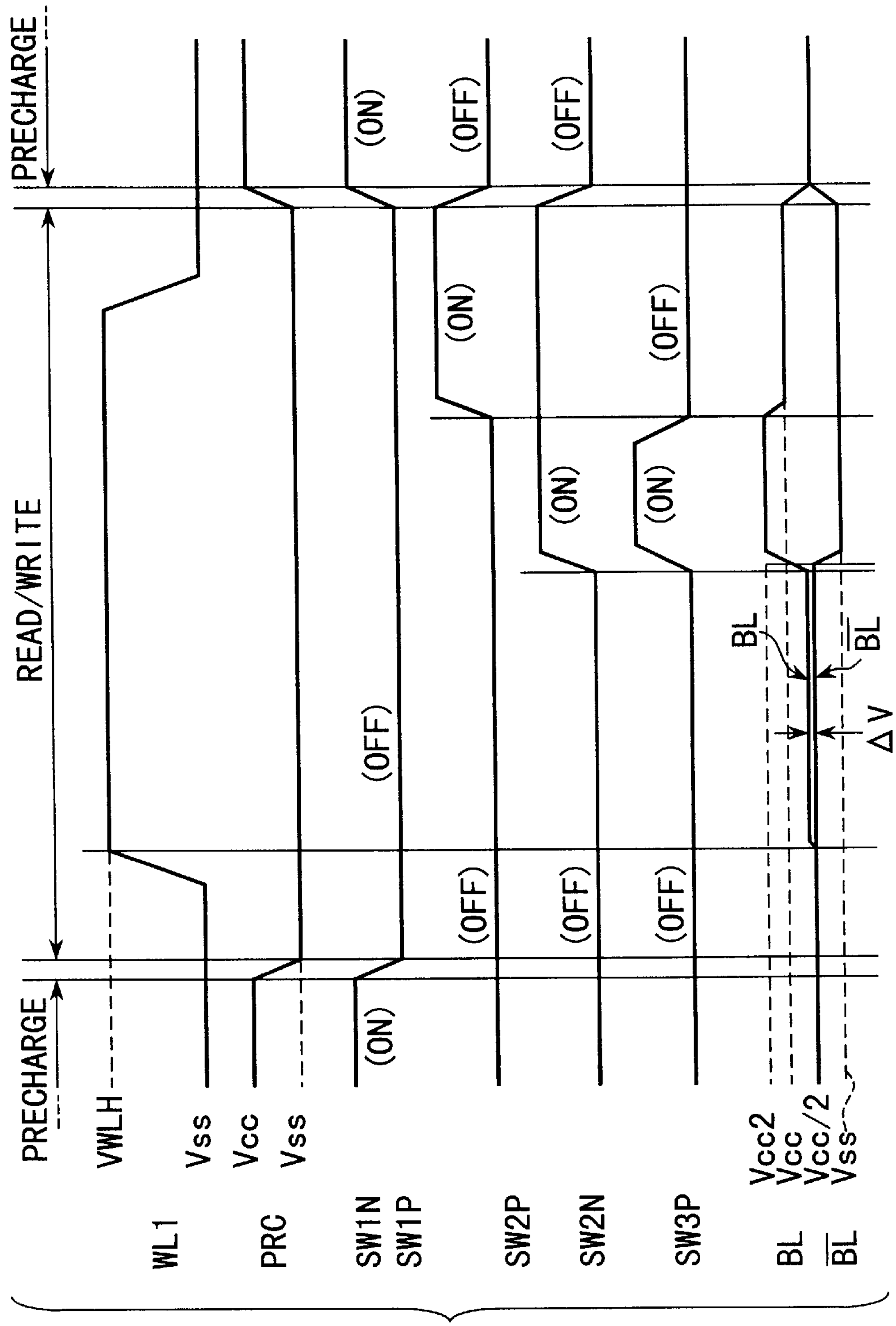
FIG. 22 is an operation waveform chart of the conventional ultra-low-voltage operation sense amplifier.

An ultra-low-voltage operation sense amplifier like the one shown in FIG. 21 has conventionally been known. In this sense amplifier, the initial operation of voltage amplification is performed by the pMOS transistor. That is, a small potential difference between the pair of bit lines BL and /BL is amplified using the p-type sense amplifier, and the amplified bit line voltage is applied to the gate of the nMOS transistor of the n-type sense amplifier to operate the n-type sense amplifier. However, the threshold voltage varies more in the pMOS transistor than in the nMOS transistor. In other words, the uniformity of pMOS transistor is worse than that of nMOS transistor. As the small potential difference between the pair of bit lines BL and /BL decreases, the read error possibility increases.

To the contrary, in the first embodiment, since the n-type sense amplifier 11 operates prior to the p-type sense amplifier 12, the initial operation of voltage amplification can be performed by the nMOS transistor. The threshold voltage varies less in the nMOS transistor than in the pMOS transistor. Therefore, the read error possibility upon a decrease in small potential difference between the pair of bit lines BL and /BL becomes lower than that in the ultra-low-voltage operation sense amplifier shown in FIG. 21.

The sense amplifier according to the first embodiment can satisfactorily cope with an ultra-low power supply voltage because of low read error possibility.

In the first embodiment, the voltages of all word lines during the standby period and the voltages of non-selected word lines during the read/write period are set to the inactive voltage of the word line VWLL lower than the ground voltage Vss. The inactive voltage of the word line VWLL suffices to be at the same level as the voltage Vss2. By applying this inactive voltage of the word line VWLL to the word line, the transfer gate transistors TR connected to the bit lines BL and /BL at the voltage Vss2 lower than the ground voltage Vss can be reliably turned off.

In the cell array devised in the above manner, even if the sense amplifier according to the first embodiment is connected to the pair of bit lines BL and /BL, the leakage current can be decreased when the potential difference between the gate and source of the transfer gate transistor TR becomes smaller than the threshold voltage.

From the same viewpoint, the voltage of the precharge signal PRC changes to the inactive voltage of the word line VWLL to turn off the equalizer 10. The voltage of a column selection signal CSL changes to the inactive voltage of the word line VWLL to turn off the column gate 15. When the nMOS transistors included in the bit line system circuit are turned off by the inactive voltage of the word line VWLL at the same level as the voltage Vss2, the bit line system circuit including the sense amplifiers 11 and 12 according to the first embodiment can be prevented from an operation error.

Other embodiments of the semiconductor integrated circuit device according to the present invention will be described. The same portions as those of the first embodiment will be indicated in the same reference numerals and their detailed description will be omitted.

Second Embodiment

Figure 5:
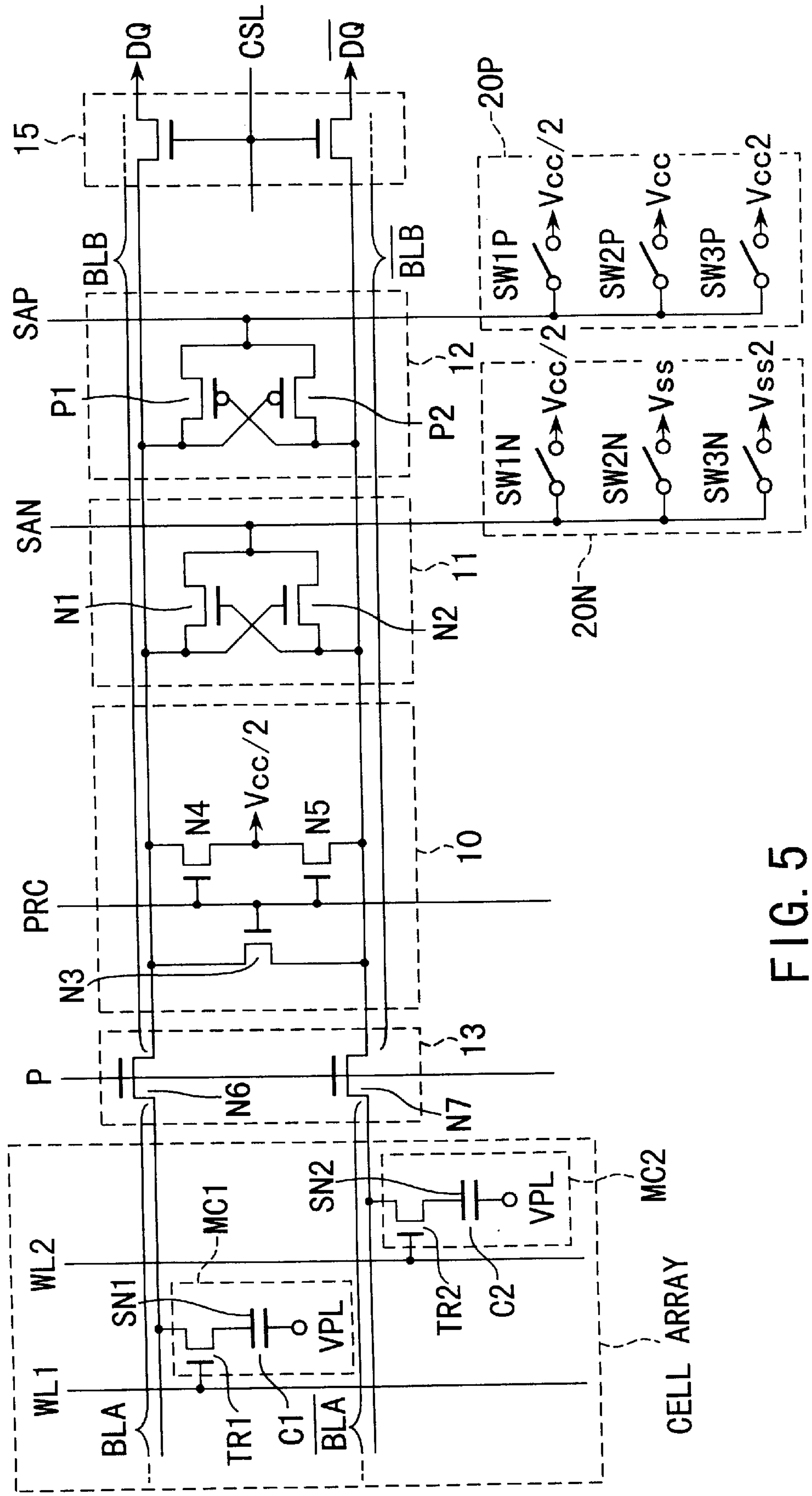
FIG. 5 is a circuit diagram of a sense amplifier according to a second embodiment of the present invention.
Figure 6:
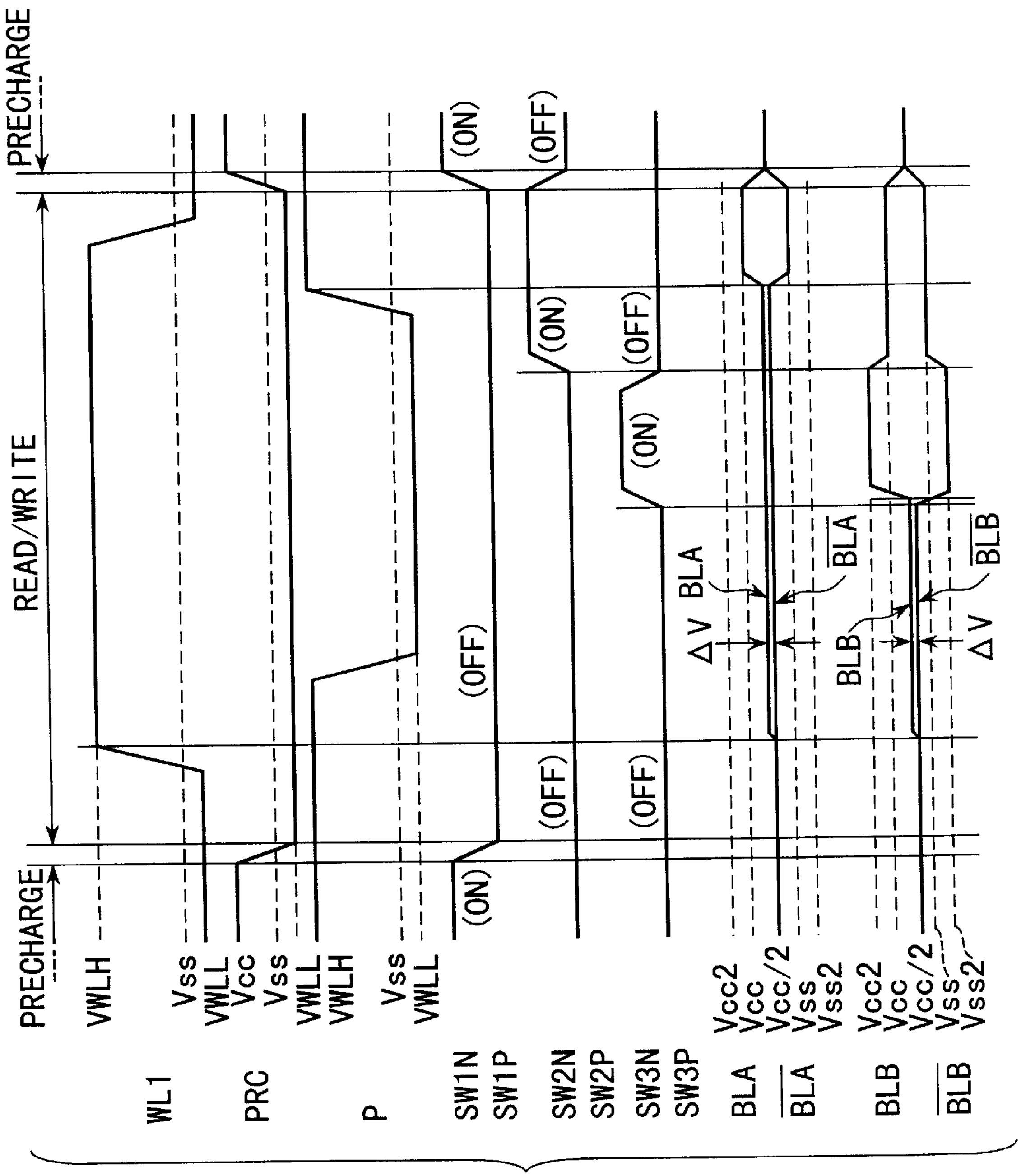
FIG. 6 is an operation waveform chart of the sense amplifier according to the second embodiment of the present invention.
Figure 7:
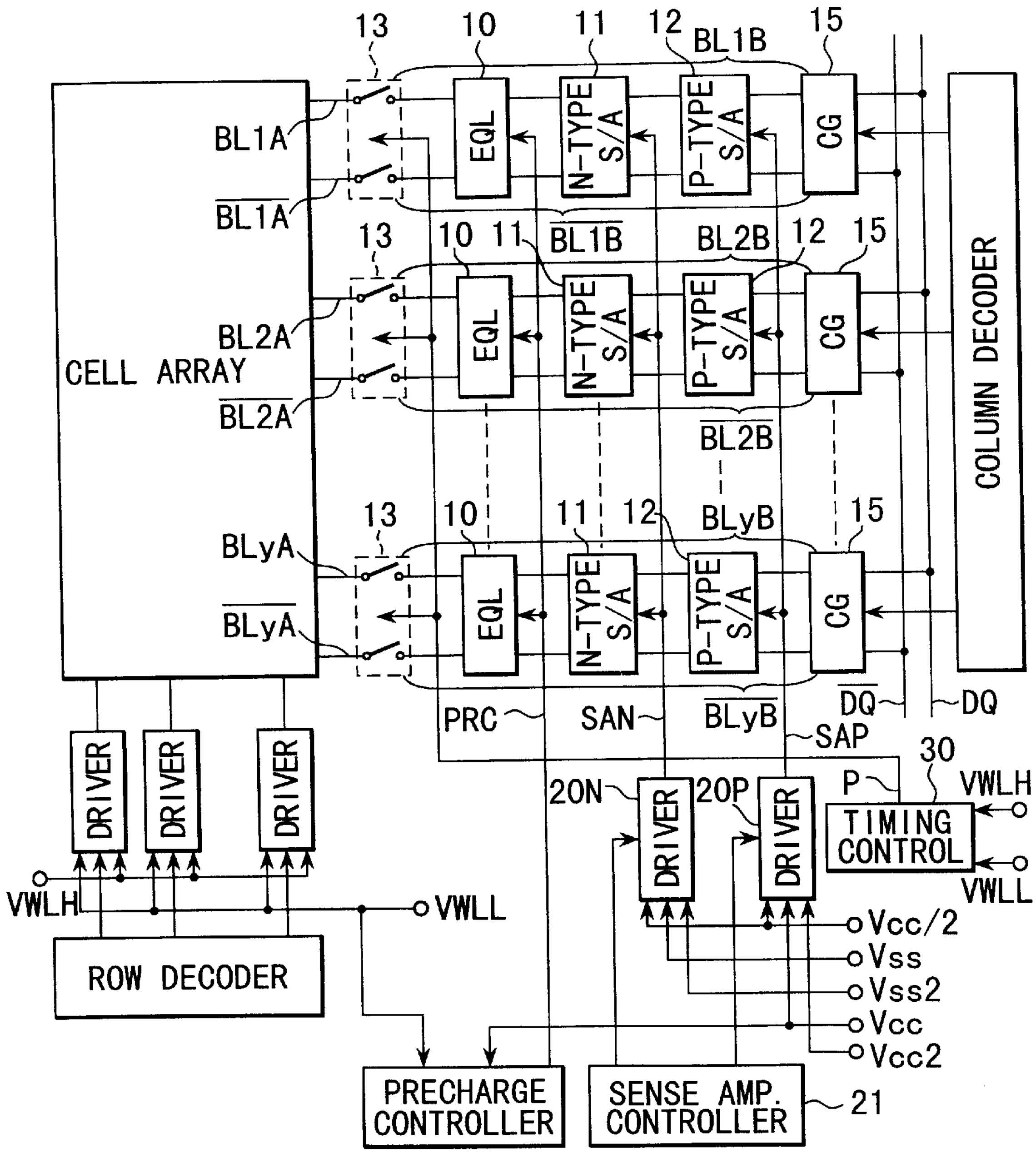
FIG. 7 is a block diagram of a DRAM having the sense amplifier according to the second embodiment of the present invention.

FIG. 5 is a circuit diagram of a DRAM according to the second embodiment. FIG. 6 is an operation waveform chart. FIG. 7 is a block diagram showing the whole arrangement of the DRAM. The same reference numerals as in FIGS. 1 to 3 denote the same parts in FIGS. 5 to 7, and only a difference will be explained.

As shown in FIGS. 5 and 7, the second embodiment is different from the first embodiment in that a gate circuit 13 is connected between a bit line system circuit and a cell array for each pair of bit lines BL and /BL. The gate circuit 13 divides the pair of bit lines BL and /BL into a pair of bit lines BLA and /BLA on the cell array side and a pair of bit lines BLB and /BLB on the bit line system circuit side.

The gate circuit 13 comprises an nMOS transistor N6 with a current path series-inserted in the bit line BL, and an nMOS transistor N7 with a current path series-inserted in the inverted bit line /BL. The nMOS transistors N6 and N7 are connected between the memory cell MC and the bit line system circuit outside the cell array, e.g., the equalizer 10, the n-type sense amplifier 11, the p-type sense amplifier 12 and the column gate 18.

The gates of the nMOS transistors N6 and N7 receive a conductive timing control signal P. The conductive timing control signal P is output from a timing controller 30 shown in FIG. 7. The timing controller 30 keeps the nMOS transistors N6 and N7 of the gate circuit 13 off while a potential difference of Vcc2−Vss2 between the pair of bit lines BLB and /BLB on the bit line system circuit side is amplified.

The operation will be explained in more detail below with reference to the operation waveform chart.

As shown in FIG. 6, during the precharge period, the conductive timing signal P is at an active voltage of the word line VWLH higher than the high voltage Vcc, and the pair of bit lines BLA and /BLA on the cell array side are connected to the pair of bit lines BLB and /BLB on the bit line system circuit side. Therefore, the operation during the standby period is the same as in the first embodiment.

In the read/write period, the voltage of a selected word line WL1 rises, and a small potential difference Δ appears in the pair of bit lines BLA and /BLA on the cell array side. At this time, the conductive timing signal P is at the active voltage of the word line VWLH higher than the high voltage Vcc, and the nMOS transistors N6 and N7 are ON. Therefore, the small potential difference Δ is also transmitted to the pair of bit lines BLB and /BLB on the bit line system circuit side. The level of the conductive timing signal P changes to an inactive voltage of the word line VWLL lower than the ground voltage Vss, and the nMOS transistors N6 and N7 are turned off, thereby disconnecting the pair of bit lines BLA and /BLA from the pair of bit lines BLB and /BLB. After that, switches SW3N and SW3P are turned on. The n-type sense amplifier 11 starts amplifying the potential, as in the first embodiment. The potential difference between the pair of bit lines BLB and /BLB is amplified from the small potential difference Δ to a potential difference of Vcc2−Vss2 larger than the power supply voltage. Then, data is read out. Upon reading out the data, the switches SW3N and SW3P are turned off, and switches SW2N and SW2P are turned on. The potential difference between the pair of bit lines BLB and /BLB decreases from the potential difference of Vcc2−Vss2 to a power supply voltage of Vcc−Vss. The level of the conductive timing signal P increases from the inactive voltage of the word line VWLL to the active voltage of the word line VWLH, and the nMOS transistors N6 and N7 are turned on. As a result, the potential difference between the pair of bit lines BLA and /BLA is amplified from the small potential difference Δ to the power supply voltage of Vcc−Vss. By the amplified potential difference, data is restored in the memory cell MCN.

In the DRAM according to the second embodiment, the gate circuit 13 prevents the potential difference of Vcc2−Vss2 larger than the power supply voltage from being transmitted to the pair of bit lines BLA and /BLA on the cell array side. No voltage higher than the power supply voltage is applied to the memory cell MC, so that a miniature memory cell MC can be realized, compared to the first embodiment in the viewpoint of device reliability.

Third Embodiment

Figure 8:
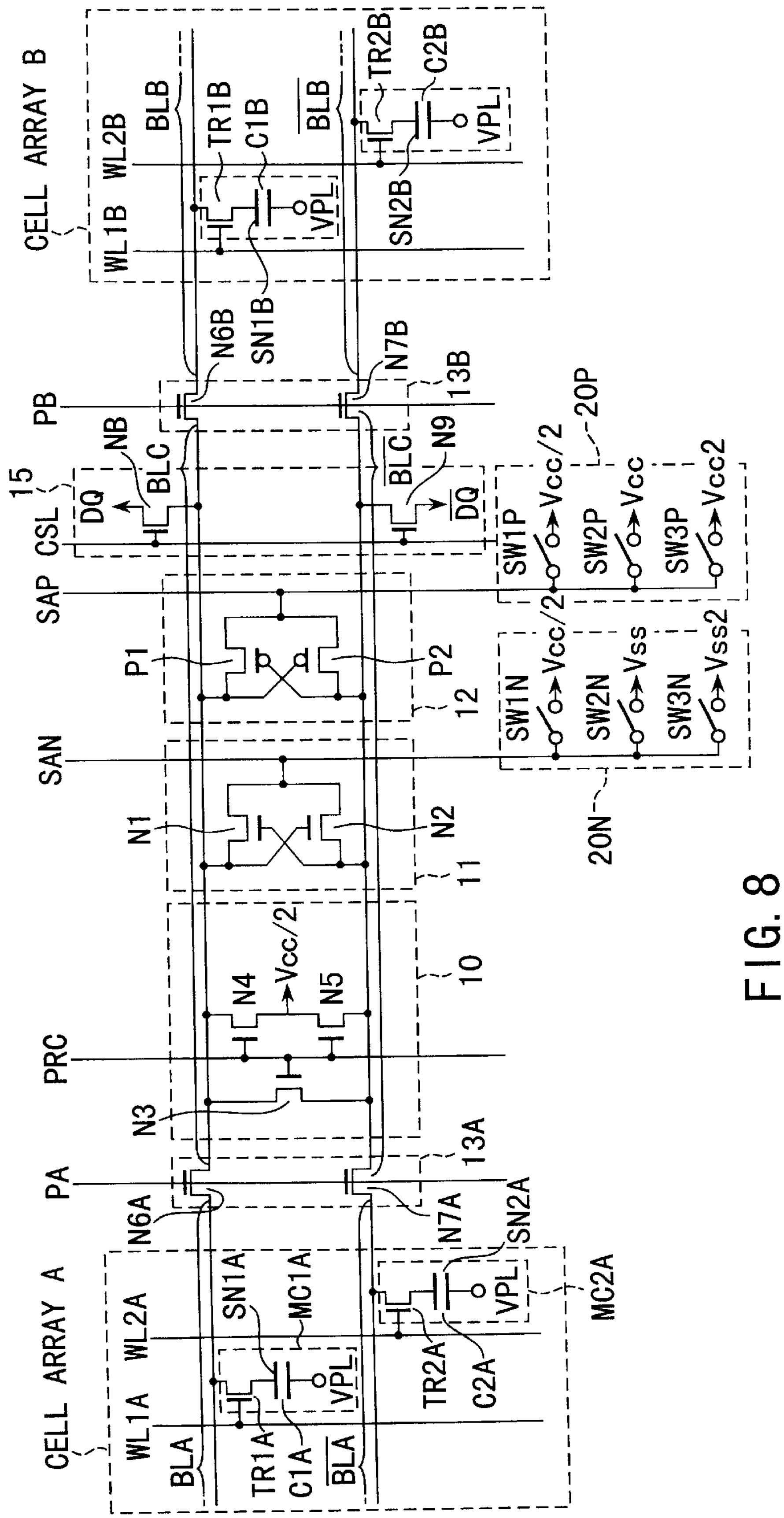
FIG. 8 is a circuit diagram of a sense amplifier according to a third embodiment of the present invention.
Figure 9:
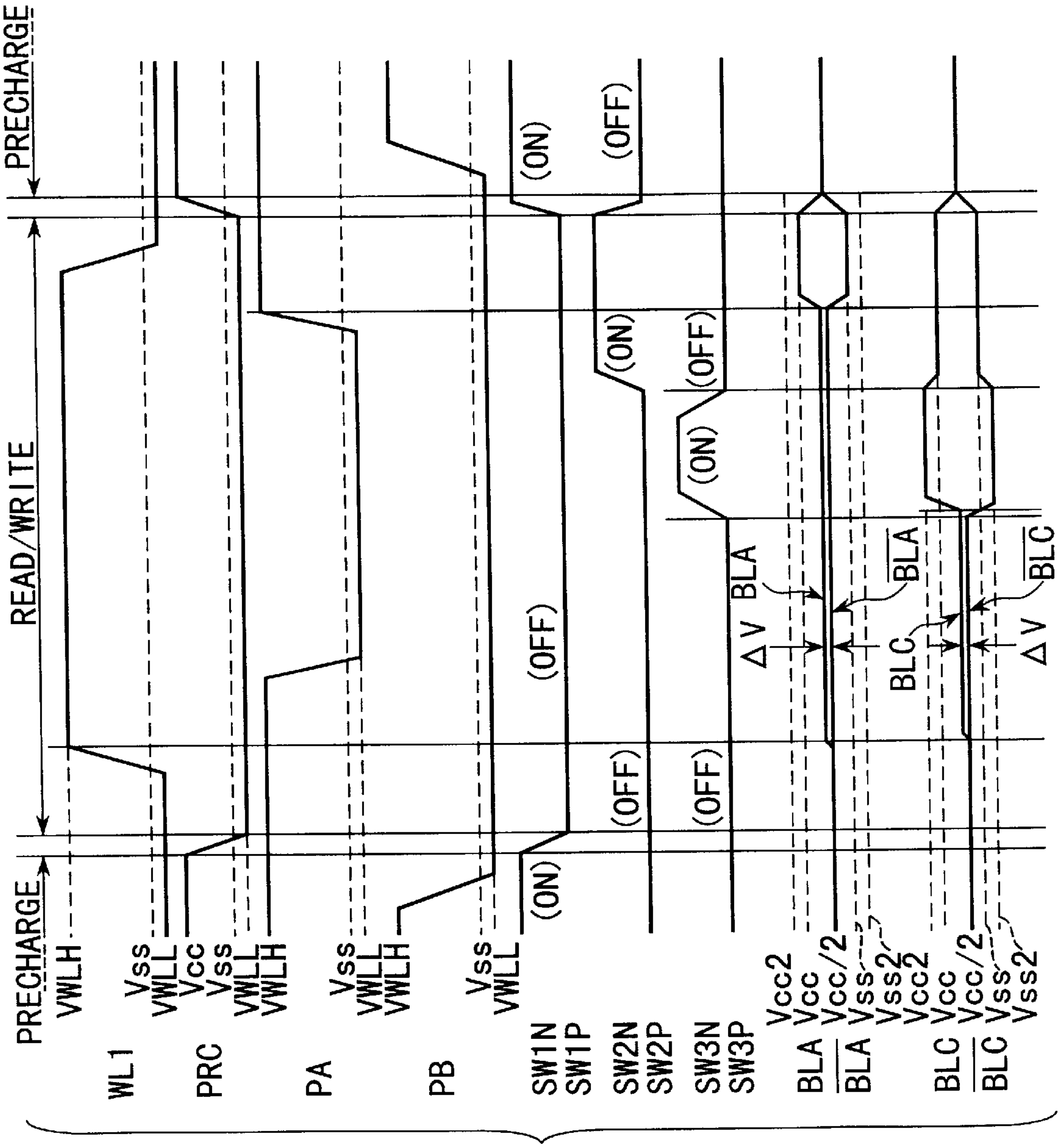
FIG. 9 is an operation waveform chart of the sense amplifier according to the third embodiment of the present invention.
Figure 10:
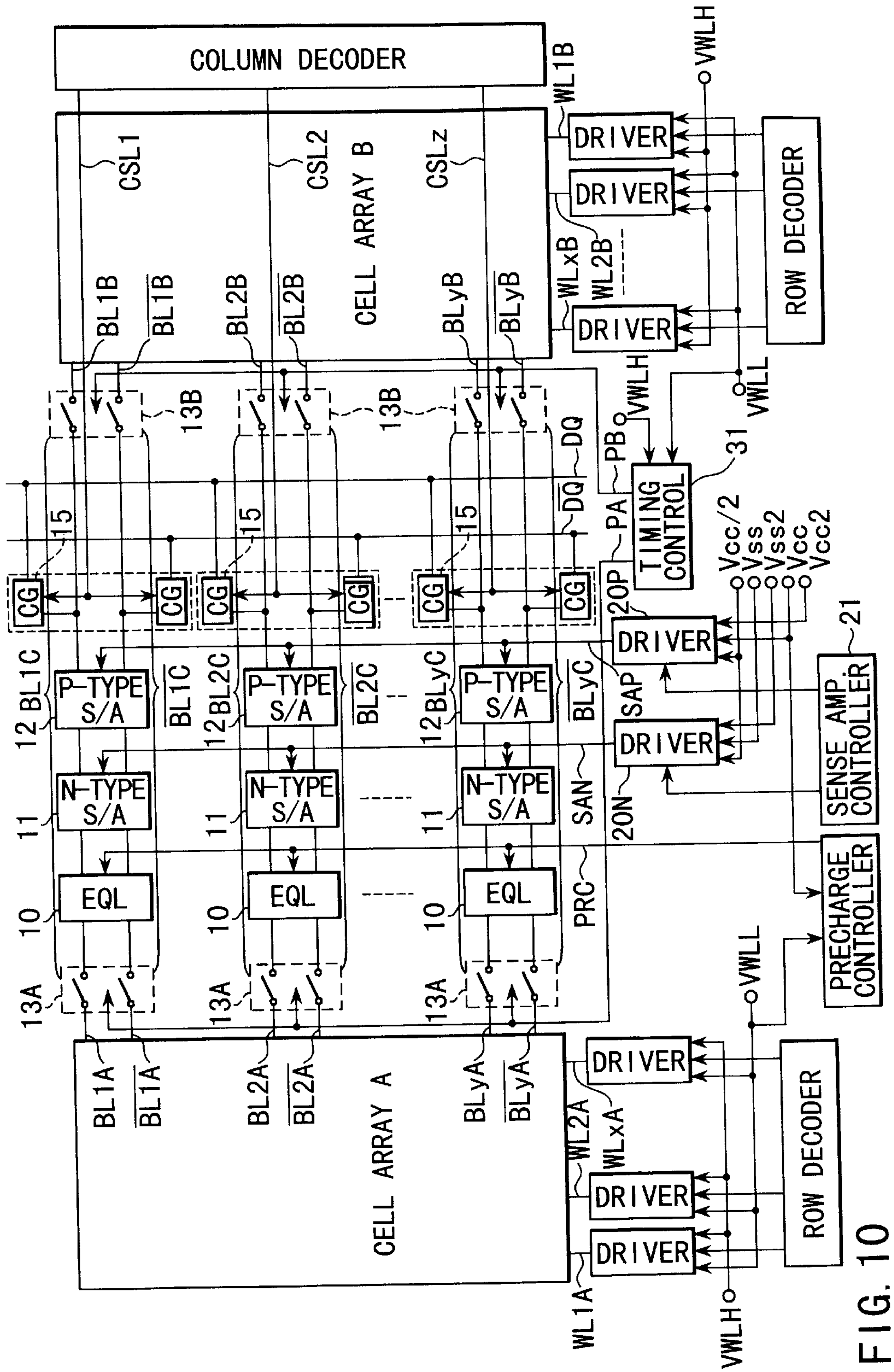
FIG. 10 is a block diagram of a DRAM having the sense amplifier according to the third embodiment of the present invention.

FIG. 8 is a circuit diagram of a DRAM according to the third embodiment. FIG. 9 is an operation waveform chart. FIG. 10 is a block diagram showing the whole arrangement of the DRAM. The same reference numerals as in FIGS. 1 to 7 denote the same parts in FIGS. 8 to 10, and only a difference will be described.

As shown in FIGS. 8 and 10, the third embodiment is different from the first and second embodiments in that cell arrays A and B have a pair of bit lines BLC and /BLC (to be referred to as a pair of common bit lines hereinafter) on a bit line system circuit side. The bit line system circuit connected to the pair of common bit lines BLC and /BLC is commonly used by the cell arrays A and B. The bit line system circuit used commonly includes the n-type and p-type sense amplifiers 11 and 12 which can operate at an ultra-low voltage as described in the first embodiment, the equalizer 10, and the column gate 15. The sense amplifiers commonly used by the cell arrays A and B are called shared sense amplifiers.

Each of bit lines BLA and /BLA in the cell array A is connected to one end of each of the common bit lines BLC and /BLC via a gate circuit 13A. Similarly, each of bit lines BLB and /BLB in the cell array B is connected to the other end of each of the common bit lines BLC and /BLC via a gate circuit 13B. The gate circuit 13A comprises an nMOS transistor N6A with one current path end connected to the bit line BLA and the other end connected to one end of the common bit line BLC, and an NMOS transistor N7A with one current path end connected to the inverted bit line /BLA and the other end connected to the other end of the inverted common bit line /BLC. Similarly, the gate circuit 13B comprises an nMOS transistor N6B with one current path end connected to the bit line BLB and the other end connected to one end of the common bit line BLC, and an nMOS transistor N7B with one current path end connected to the inverted bit line /BLB and the other end connected to the other end of the inverted common bit line /BLC. The gates of the nMOS transistors N6A and N7A receive an ON timing control signal PA, whereas the gates of the nMOS transistors N6B and N7B receive an ON timing control signal PB. The ON timing control signals PA and PB are output from a timing controller 31 shown in FIG. 10. To read/write data, the timing controller 31 selects either one of the cell arrays A and B and connects the selected cell array A or B to data lines DQ and /DQ. During the read/write period, the timing controller 31 controls the selected cell array A or B to keep the nMOS transistors N6A and N7A of the gate circuit 13A or the nMOS transistors N6B and N7B of the gate circuit 13B off while a potential difference of Vcc2−Vss2 between the pair of common bit lines BLC and /BLC is amplified.

The operation will be explained in more detail with reference to the operation waveform chart.

As shown in FIG. 9, during the precharge period, the ON timing signals PA and PB are at the active voltage of the word line VWLH higher than the high voltage Vcc. The pair of bit lines BLA and /BLA and the pair of bit lines BLB and /BLB are connected to the pair of common bit lines BLC and /BLC. With this setting, the potential difference between the pair of bit lines BLA and /BLA and the potential difference between the pair of bit lines BLB and /BLB are equalized by the equalizer 10. Before a selected word line is raised, which of the cell arrays A and B is accessed is determined.

According to this determination, while the pair of bit lines in the cell array to be accessed are kept connected to the pair of common bit lines BLC and /BLC, the pair of bit lines in the cell array not to be accessed are disconnected from the pair of common bit lines BLC and /BLC. FIG. 9 shows the state wherein the cell array A is accessed. While the ON timing signal PA is kept at the active voltage of the word line VWLH, the signal PB changes to the inactive voltage of the word line VWLL. Accordingly, while the nMOS transistors N6A and N7A are kept on, the nMOS transistors N6B and N7B are turned off.

In the read/write period, the gate circuit 13A operates similarly to the gate circuit 13 in the second embodiment. Therefore, the operation during the read/write period is the same as in the second embodiment.

In the DRAM according to the third embodiment, the ultra-low-voltage operation sense amplifier described in the first embodiment is applied to a so-called shared sense amplifier. In this manner, the sense amplifier according to the present invention can be of a shared type. In general applications, the gate circuits 13A and 13B are not turned off and continuously connects a pair of bit lines in a cell array to a pair of common node lines during the read/write period.

The gate circuits 13A and 13B of the third embodiment however employ the operation of the gate circuit 13 described in the second embodiment. That is, even a selected gate is turned off during the read/write period while the small potential difference Δ between the pair of common node lines is amplified. With this arrangement, in the third embodiment, no voltage higher than the power supply voltage need be applied to the memory cell MC in the DRAM having the shared sense amplifier which can operate at an ultra-low voltage, and a smaller memory cell MC can be realized similar to in the second embodiment.

Fourth Embodiment

Figure 11:
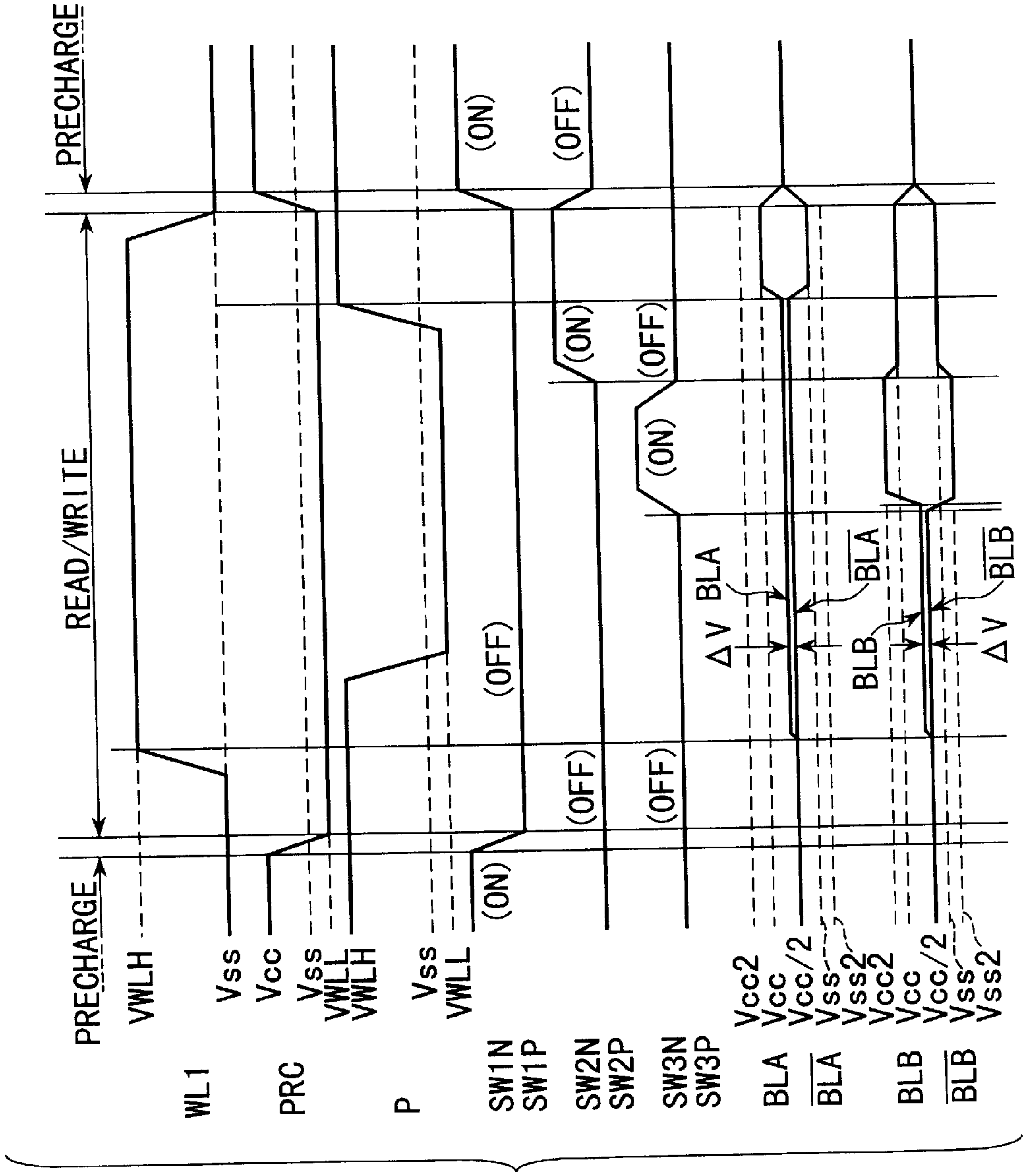
FIG. 11 is an operation waveform chart of a sense amplifier according to a fourth embodiment of the present invention.
Figure 12:
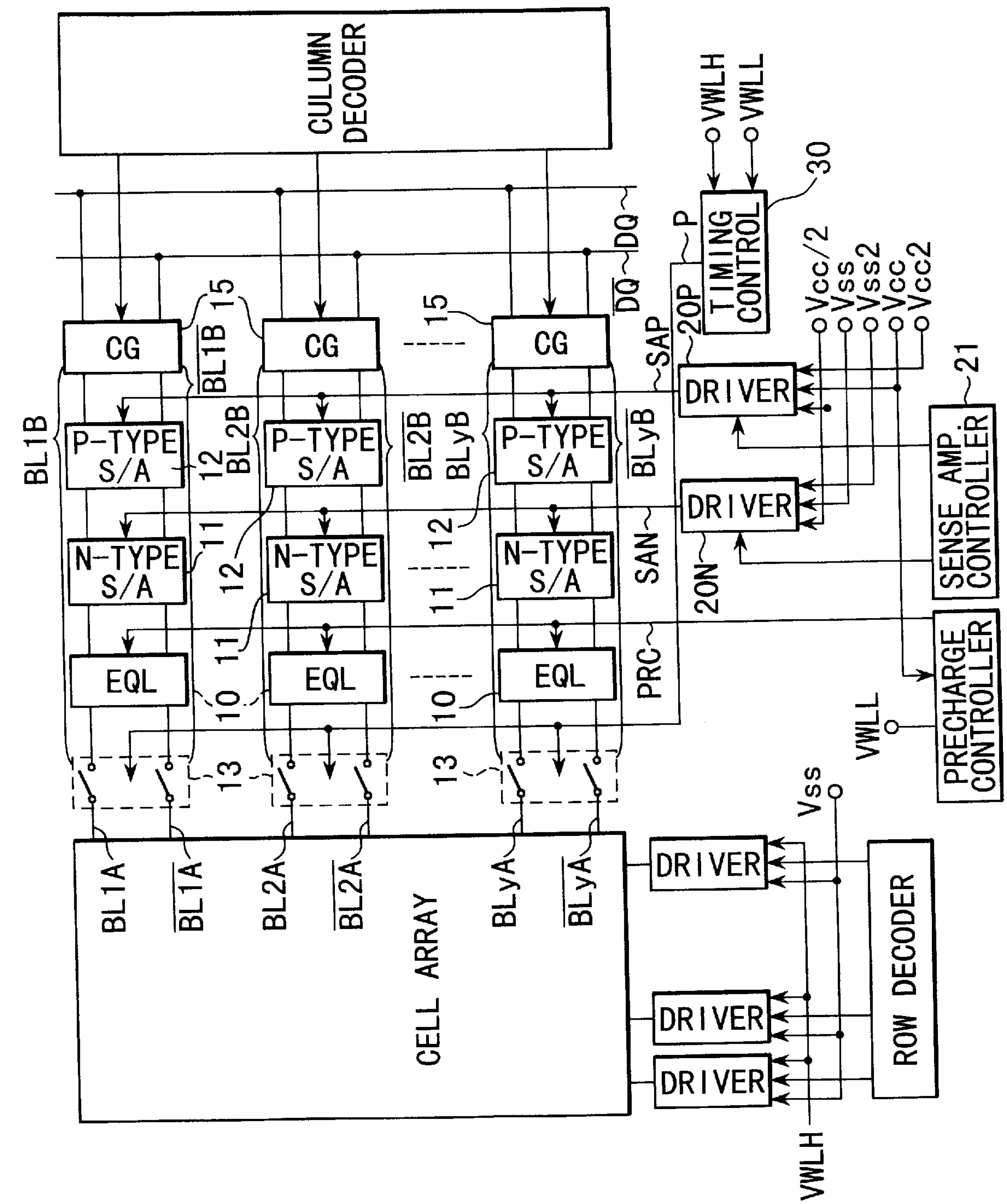
FIG. 12 is a block diagram of a DRAM having the sense amplifier according to the fourth embodiment of the present invention.

FIG. 11 is an operation waveform chart of a DRAM according to the fourth embodiment. FIG. 12 is a block diagram showing the whole arrangement of the DRAM. The same reference numerals as in FIGS. 6 and 7 denote the same parts in FIGS. 11 and 12, and only a difference will be described.

As shown in FIG. 11, the fourth embodiment is different from the second embodiment in that the word line voltage is the ground voltage Vss in a standby or non-selected state.

As shown in FIG. 12, the fourth embodiment adopts the gate circuit 13 identical to that in the second embodiment. A potential difference of Vcc2−Vss2 amplified to be higher than the power supply voltage can be prevented from being transmitted to bit lines BLA and /BLA on the cell array side. In addition, the potential difference between the bit lines BLA and /BLA on the cell array side can be set to a power supply voltage of Vcc−Vss in a rewrite state. By setting the potential difference between the bit lines BLA and /BLA on the cell array side to the power supply voltage of Vcc−Vss in a rewrite, the subthreshold leakage can be satisfactorily suppressed similar to the first to third embodiments even if the word line voltage is set to the ground voltage Vss in the standby or non-selected state.

When the word line voltage is set to the ground voltage Vss in the standby or non-selected state, the voltage can be stabilized more easily than the case wherein the word line voltage is set to the inactive voltage of the word line VWLL lower than the ground voltage Vss.

In the first to third embodiments, the inactive voltage of the word line VWLL is generated by a voltage generator arranged in an integrated circuit chip, e.g., a step-down charge pump circuit made up of a pMOS transistor and a capacitor, for instance. The inactive voltage of the word line VWLL is supplied to a word line driver, a precharge controller, a timing controller, and the like. In the fourth embodiment, however, no inactive voltage of the word line VWLL need to be supplied to the word line driver, so that the circuit scale of the voltage generator can be decreased. Particularly when the voltage generator is a step-down charge pump circuit, the capacitor area can be decreased to suppress an increase in chip size of the integrated circuit.

Fifth Embodiment

Figure 13:
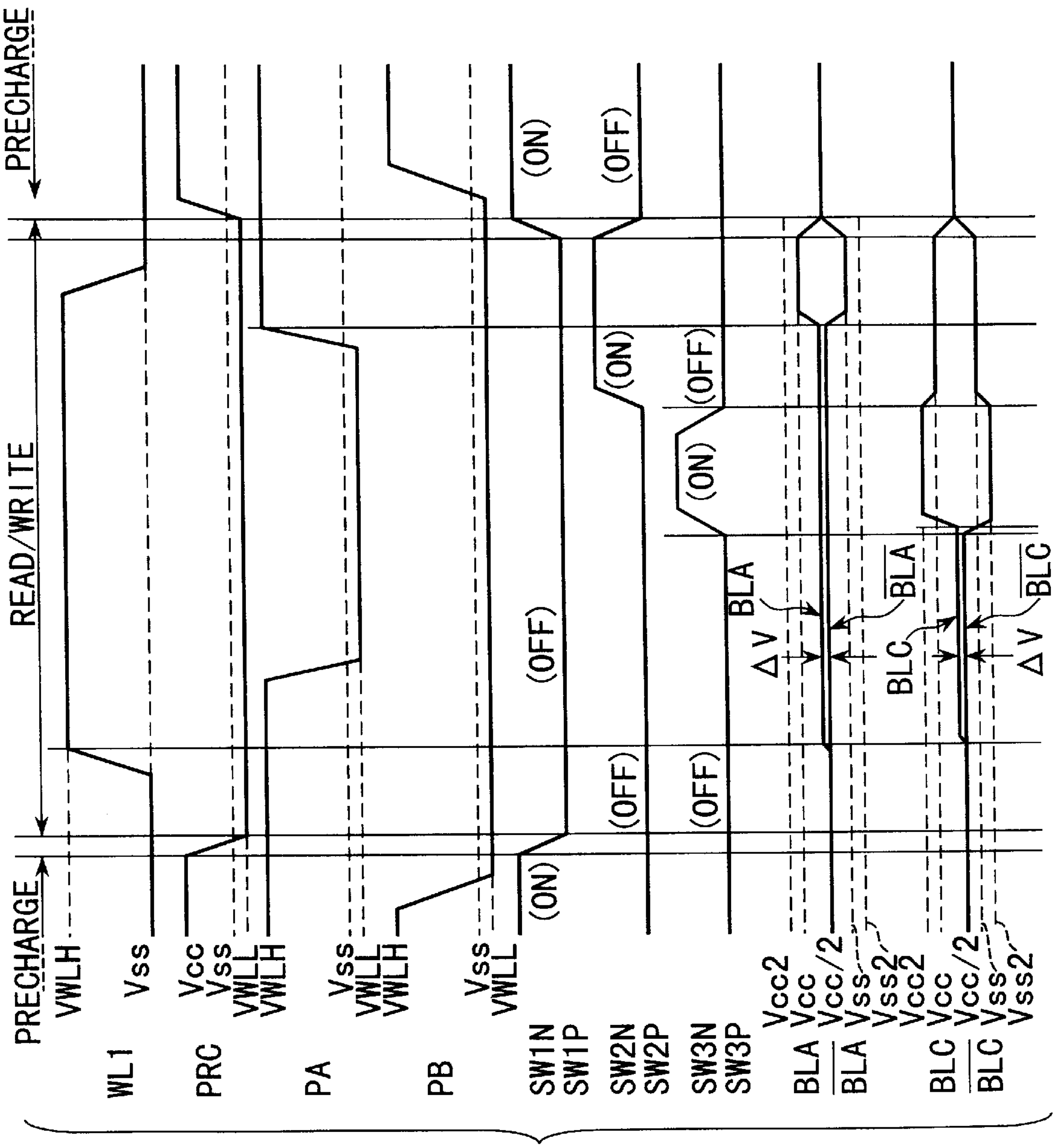
FIG. 13 is an operation waveform chart of a sense amplifier according to a fifth embodiment of the present invention.
Figure 14:
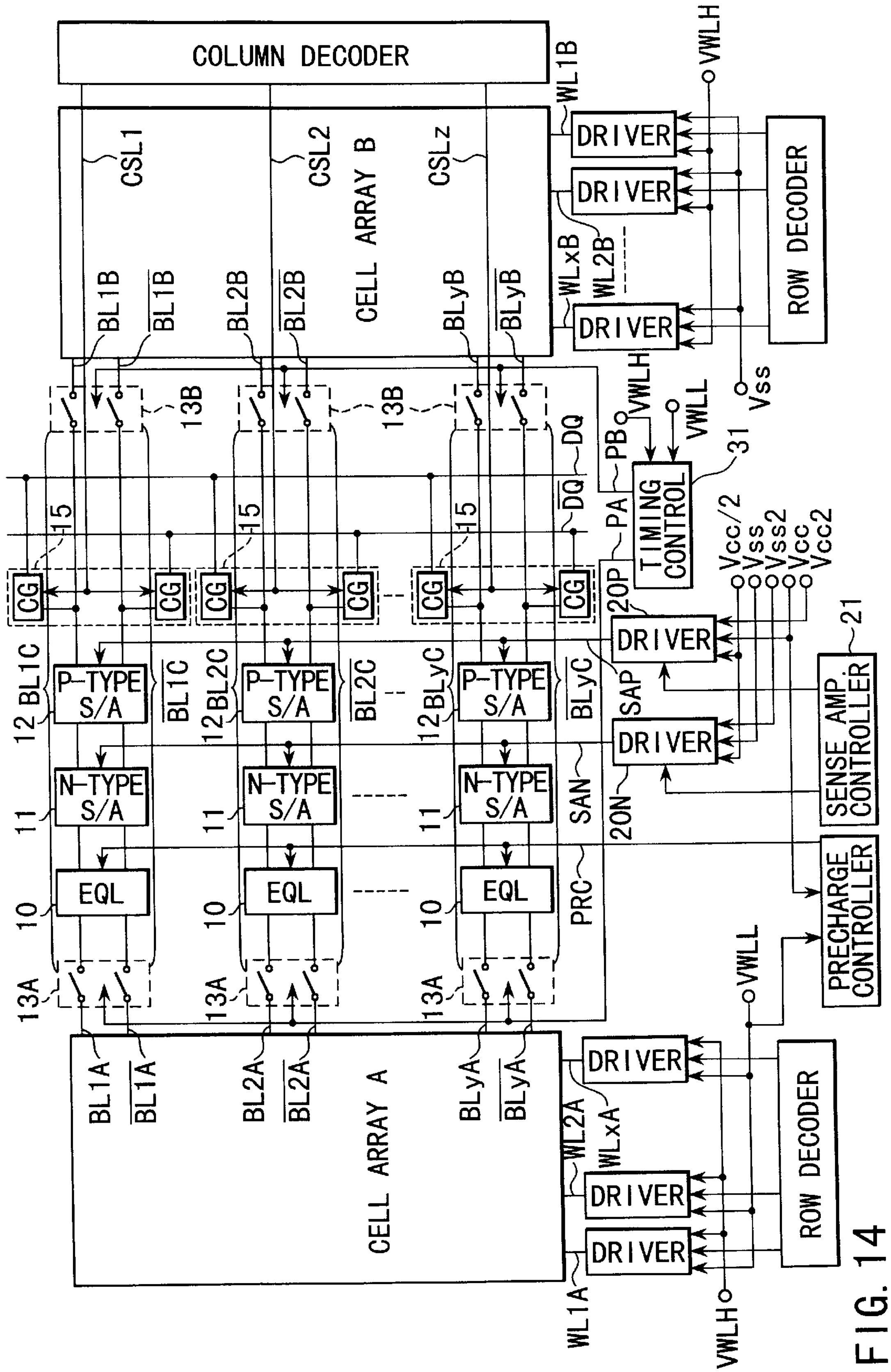
FIG. 14 is a block diagram of a DRAM having the sense amplifier according to the fifth embodiment of the present invention.

FIG. 13 is an operation waveform chart of a DRAM according to the fifth embodiment. FIG. 14 is a block diagram showing the whole arrangement of the DRAM. The reference numerals as in FIGS. 9 and 10 denote the same parts as in FIGS. 13 and 14, and only a difference will be described.

As shown in FIG. 13, the fifth embodiment is different from the third embodiment in that the word line voltage is the ground voltage Vss in a precharge or non-selected state. That is, the fifth embodiment is an application of the fourth embodiment to a DRAM having a shared sense amplifier.

In the fifth embodiment, the word line voltage can be easily stabilized in the precharge or non-selected state in the DRAM having the shared sense amplifier, as described in the fourth embodiment. Moreover, the circuit scale of a voltage generator for generating the inactive voltage of the word line VWLL can be decreased.

Sixth Embodiment

Figure 15:
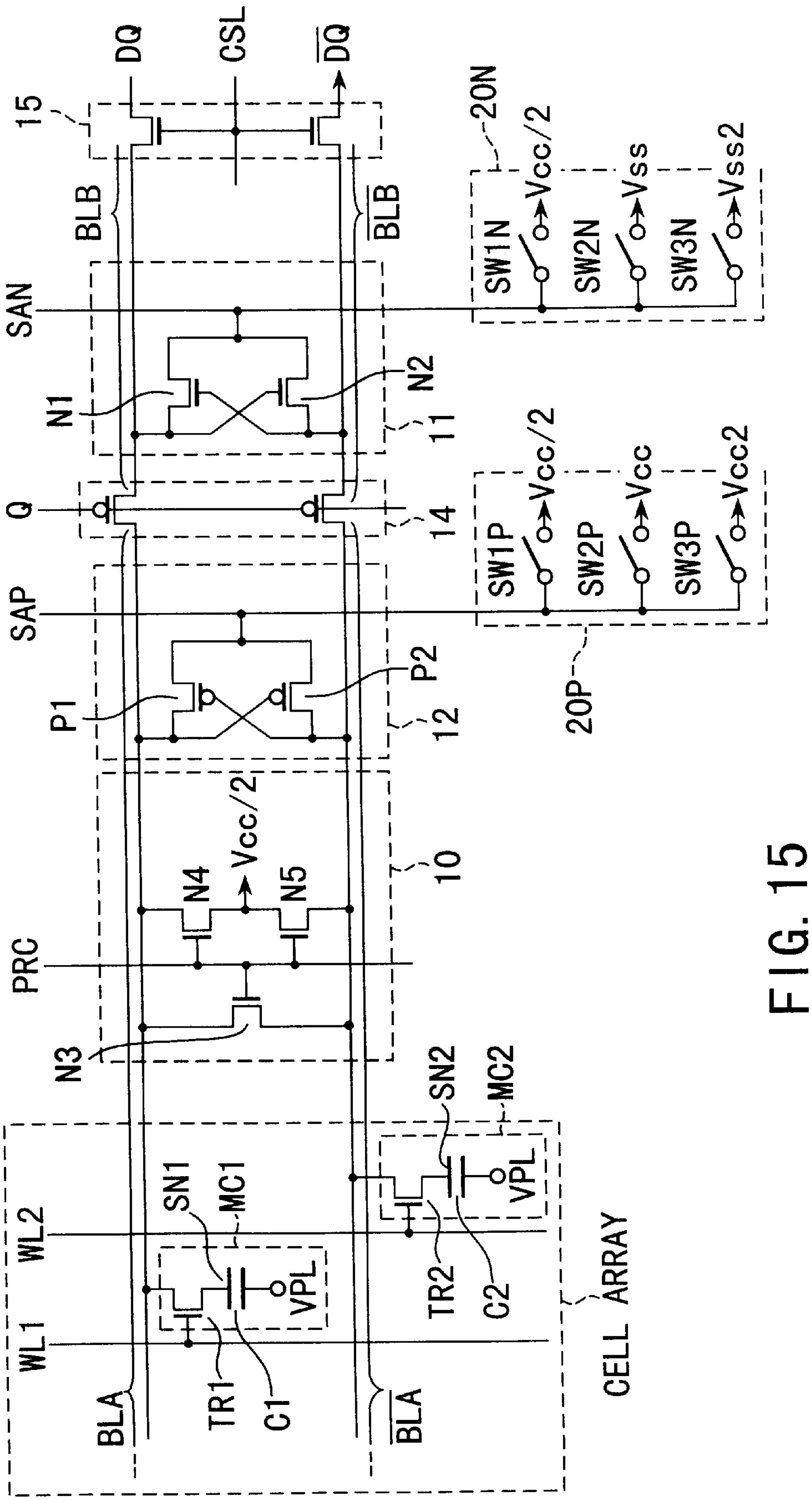
FIG. 15 is a circuit diagram of a sense amplifier according to a sixth embodiment of the present invention.
Figure 16:
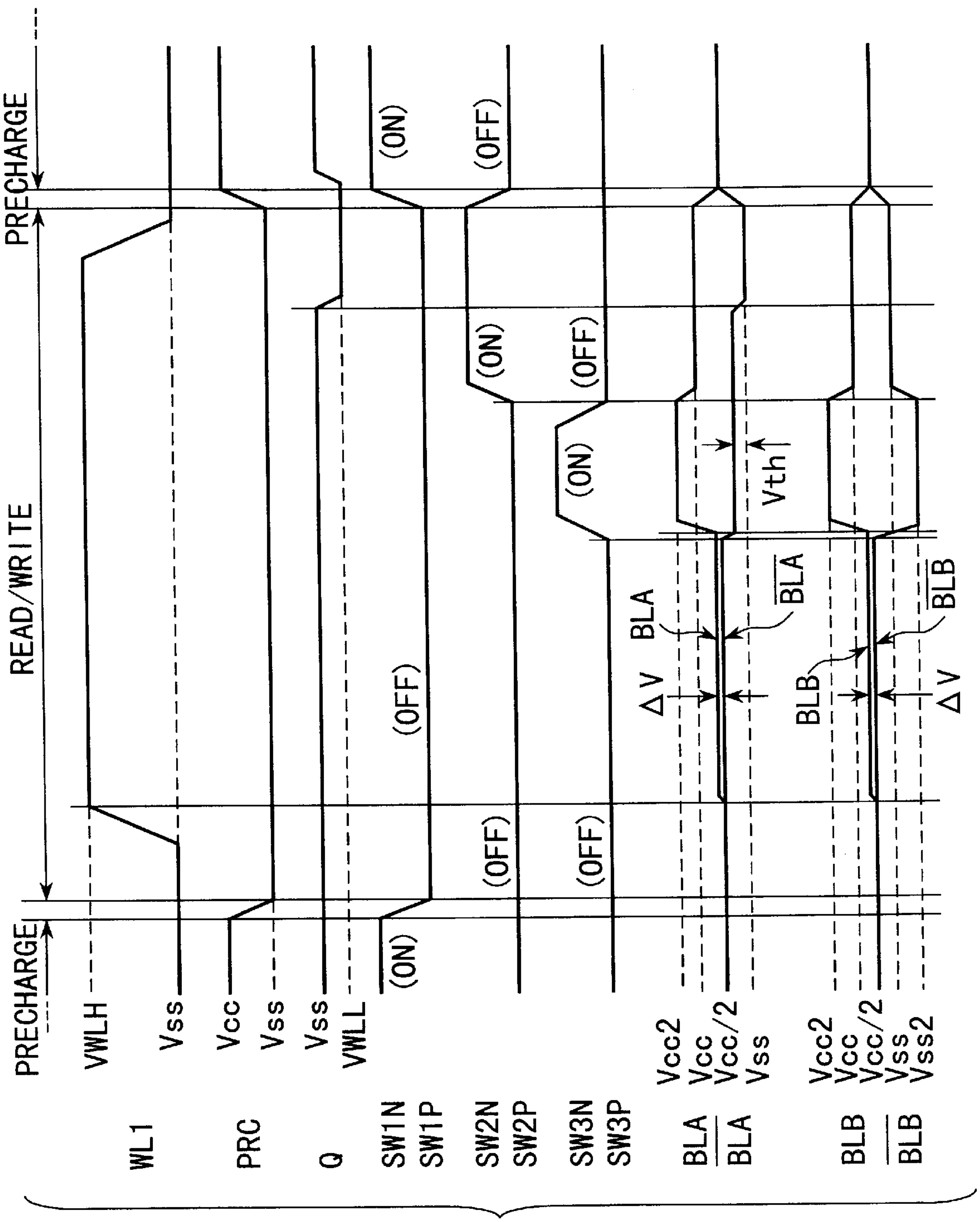
FIG. 16 is an operation waveform chart of the sense amplifier according to the sixth embodiment of the present invention.
Figure 17:
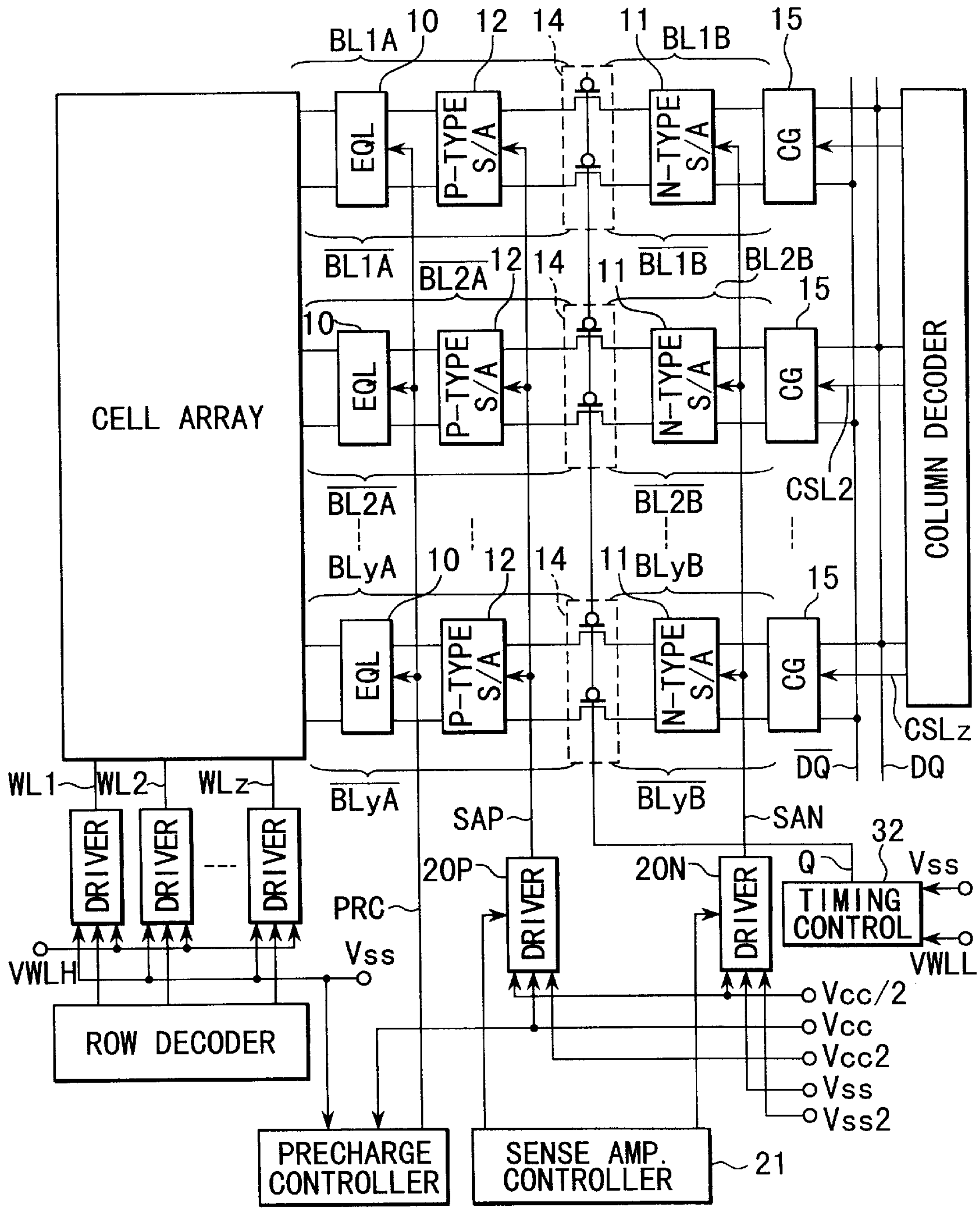
FIG. 17 is a block diagram of a DRAM having the sense amplifier according to the sixth embodiment of the present invention.

FIG. 15 is a circuit diagram of a DRAM and a bit line sense amplifier of the DRAM according to the sixth embodiment of the present invention. FIG. 16 is an operation waveform chart. FIG. 17 is a block diagram showing the whole arrangement of the DRAM. The same reference numerals as in FIGS. 1 to 3 denote the same parts in FIGS. 15 to 17, and only a difference will be described.

As shown in FIGS. 15 and 17, the sixth embodiment is different from the first embodiment in that a gate circuit 14 which adjusts the amplitude of the potential difference between a pair of bit lines is arranged for each pair of bit lines BL and /BL. The gate circuit 14 comprises a pMOS transistor P3 with a current path series-inserted in the bit line BL, and a pMOS transistor P4 with a current path series-inserted in the inverted bit line /BL. The pMOS transistor P3 divides the bit line BL into BLA and BLB. Similarly, the PMOS transistor P4 divides the inverted bit line /BL into /BLA and /BLB. The gate circuit 14 described in the sixth embodiment particularly limits that of large voltage difference of Vcc2−Vss2 applied to only the part of bit lines BLB and /BLB, where the n-type sense amplifier 11 and column gate 15 are arranged. The other part of bit lines, BLA and /BLA, receive the less voltage difference than Vcc2−Vss2 by the effect of the threshold voltage of pMOS transistors P3 and P4 of the gate circuit 14.

The gates of the pMOS transistors P3 and P4 receive an amplitude timing control signal Q. The amplitude timing control signal Q is output from a timing controller 32 shown in FIG. 17. The timing controller 32 controls the gate voltages of the pMOS transistors P3 and P4 so as not to transfer the lower voltage generated by the n-type sense amplifier 11 at BLB and /BLB to BLA and /BLA by applying the ground voltage Vss to the gates of the PMOS transistors P3 and P4 of the gate circuit 14 when SW2N is driven by the lower voltage vss2. The controller 32 also controls the gate voltage of the pMOS transistors P3 and P4 to compensate an effect of the threshold during the rewrite period by applying the inactive voltage of the word line VWLL lower than the ground voltage Vss to the gates of the pMOS transistors P3 and P4.

The operation will be explained in more detail with reference to the operation waveform chart.

As shown in FIG. 16, the control signal Q is at the ground voltage Vss during the precharge period and the read/write period, particularly the read period. Therefore, the operation timings during the precharge and read periods are the same as in the first embodiment except that the potential difference between the pair of bit lines BLB and /BLB is Vcc2−Vss2 and the potential difference between the pair of bit lines BLA and /BLA is Vcc2−Vss+Vth. "Vth" is the threshold voltage of each of the pMOS transistors P3 and P4. While the control signal Q is at the ground voltage Vss, the voltage of the drain of one of the PMOS transistors whose source is connected to the bit line at the voltage Vss2 is not decreased to Vss2. It is only decreased to Vss+Vth.

After the read period, switches SW3N and SW3P are turned off, and switches SW2N and SW2P are turned on. During the write period, the level of the control signal Q decreases to the inactive voltage of the word line VWLL lower than the ground voltage Vss. While the control signal Q is at the inactive voltage of the word line VWLL, there is no effect of the threshold voltage so that the voltage differences between the source and the drain of the pMOS transistors P3 and P4 are the same as described above.

According to the sixth embodiment, the potential difference between the pair of bit lines BLA and /BLA is Vcc2−Vss+Vth smaller than a potential difference of Vcc2−Vss2. Compared to the first embodiment, the maximum voltage applied to the memory cell MC can be decreased, and a miniature memory cell MC can be realized, as described in the second embodiment.

During the rewrite period, the level of the control signal Q is decreased to the inactive voltage of the word line VWLL to reduce an effect of the threshold voltage of the pMOS transistor. In restoring "0"-level data, the bit line can be at almost the ground voltage Vss, and data "0" can be satisfactorily restored in the memory cell MC.

In the sixth embodiment, the voltages of the pair of bit lines BLA and /BLA on the cell array side can be prevented from decreasing to the sufficiently low voltage Vss2. Accordingly, even if the word line voltage is set to the ground voltage Vss shown in FIG. 16, not to the inactive voltage of the word line VWLL in a standby or non-selected state, the subthreshold leakage can be suppressed. The same effects as those described in the fourth embodiment can be obtained.

The gate circuit 14 is not necessarily connected between the n-type sense amplifier 11 and the p-type sense amplifier 12, as shown in FIGS. 15 and 17, and can be connected between, e.g., the p-type sense amplifier 12 and the equalizer 10 or the equalizer 10 and the memory cell array.

However, if the gate circuit 14 is connected between the n-type sense amplifier 11 and the p-type sense amplifier 12, as shown in FIGS. 15 and 17, the maximum voltage applied to the p-type sense amplifier 12 and the equalizer 10 can be decreased, and MOSFETs constituting the p-type sense amplifier 12 and the equalizer 10 can be miniaturized.

In addition, if the gate circuit 14 is connected between the n-type sense amplifier 11 and the p-type sense amplifier 12, the voltage can be amplified separately for the pair of bit lines BLA and /BLA on the cell array side and the pair of bit lines BLB and /BLB on the bit line system circuit side. In other words, the capacitance of the pair of bit lines which should be amplified by the n-type sense amplifier 11 can be decreased in comparison with the first to fifth embodiments. The voltage can be amplified at a higher speed than in the first to fifth embodiments.

The sixth embodiment is also applicable to the shared sense amplifier described in the third and fifth embodiments. In this case, gate circuits 13A and 13B may be arranged in addition to the gate circuit 14, or the gate circuit 14 itself may operate like the gate circuits 13A and 13B which selectively connect and disconnect the bit lines in the cell arrays to the bit line system circuits. When the gate circuit 14 itself operates like the gate circuits 13A and 13B, a pMOS transistor constituting the gate circuit 14 on a non-selected cell array side is turned off by applying the high voltage Vcc or the active voltage of the word line VWLH to the gate, whereas the ground voltage Vss is applied to the gate of a pMOS transistor constituting the gate circuit 14 on a selected cell array side, as described above, and particularly the inactive voltage of the word line VWLL is applied thereto during the rewrite period.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the gate circuits 13, 13A, and 13B described in the second to fifth embodiments can be connected between the n-type sense amplifier 11 and the p-type sense amplifier 12, like in the sixth embodiment.

As has been described above, according to the present invention, a semiconductor memory device having a memory function and a sense amplifier which can operate at a low voltage and can ensure a satisfactory operation margin can be provided.

I claim:

1. A semiconductor integrated circuit device comprising:

a plurality of word lines;

a plurality of bit lines;

a plurality of memory cells each having a capacitor capable of storing data having one of at least two voltages, and a transfer gate transistor for controlling connection between said capacitor and said bit line in accordance with a voltage of said word line;

an n-type sense amplifier having a first n-channel FET with a drain connected to a first bit line of said plurality of bit lines and a gate connected to a second bit line, and a second n-channel FET with a drain connected to said second bit line and a gate connected to said first bit line;

an n-type sense amplifier driver for applying an n-type sense amplifier activating voltage to sources of said first and second n-channel FETs; and a sense amplifier controller for setting the n-type sense amplifier activating voltage applied by said n-type sense amplifier driver to a first voltage lower than the lowest voltage of data stored in said capacitor in activating said n-type sense amplifier, and setting the n-type sense amplifier activating voltage applied by said n-type sense amplifier driver to a second voltage substantially equal to the lowest voltage of data stored in said capacitor in restoring data in said capacitor of said memory cell.

2. A device according to claim 1, in which said word lines have a voltage substantially equal to the second voltage or a third voltage lower than the second voltage in at least either one of a standby state and a non-selected state.

3. A device according to claim 1, in which the second voltage is equal to a ground voltage.

4. A device according to claim 1, which further comprises:

a p-type sense amplifier having a first p-channel FET with a drain connected to said first bit line and a gate connected to said second bit line, and a second p-channel FET with a drain connected to said second bit line and a gate connected to said first bit line; and a p-type sense amplifier driver for applying a p-type sense amplifier activating voltage to sources of said first and second p-channel FETs, and in which said sense amplifier controller sets the p-type sense amplifier activating voltage applied by said p-type sense amplifier driver to a fourth voltage higher than the highest voltage of data stored in said capacitor in activating said p-type sense amplifier, and sets the p-type sense amplifier activating voltage applied by said p-type sense amplifier driver to a fifth voltage substantially equal to the highest voltage of data stored in said capacitor in restoring data in said capacitor of said memory cell.

5. A device according to claim 4, in which a difference between the lowest and highest voltages of data stored in said capacitor is substantially equal to a power supply voltage, and a difference between the first and fourth voltages is not less than the power supply voltage.

6. A device according to claim 1, which further comprises:

a gate circuit having an n-channel FET for connecting first and second portions of the first and second bit lines, said first portion being connected to said plurality of memory cells, said second portion being connected to said n-type sense amplifier, and in which said n-channel FET of said gate circuit is turned off by setting a voltage of a gate of said n-channel FET of said gate circuit to a sixth voltage not more than the second voltage when the n-type sense amplifier activating voltage is set to the first voltage, and said n-type sense amplifier is activated.

7. A device according to claim 1, which further comprises:

a first gate circuit having an n-channel FET for connecting first and third portions of the first and second bit lines, and a second gate circuit having an n-channel FET for connecting a second portion and said third portion of the first and second bit lines, said first portion being connected to a first memory cell group of said plurality of memory cells, said second portion being connected to a second memory cell group of said plurality of memory cells, said third portion being connected to said n-type sense amplifier, and in which one of said gate circuits of the first and second gate circuits is turned off by setting a voltage of a gate of said n-channel FET included in either one of said first and second gate circuits to a seventh voltage not higher than the second voltage when a standby state shift to a read/write state.

8. A device according to claim 7, in which while the n-type sense amplifier activating voltage is set to the first voltage after the standby state shifts to the read/write state, the other gate circuit of the first and second gate circuits is turned off by setting the voltage of the gate of said n-channel FET included in the other gate circuit to the seventh voltage.

9. A device according to claim 7, in which the third portion is connected to a bit line precharge circuit for precharging said bit lines to a precharge voltage.

10. A device according to claim 1, which further comprises:

a gate circuit having a p-channel FET which has a negative threshold voltage and connects first and second portions of the first and second bit lines, said first portion being connected to said plurality of memory cells, said second portion being connected to said n-type sense amplifier; and a timing controller for setting a voltage of a gate of said p-channel FET of said gate circuit to an eighth voltage substantially equal to the second voltage when the n-type sense amplifier activating voltage is set to the first voltage and said n-type sense amplifier is activated, and setting the voltage of said gate of said p-channel FET of said gate circuit to a ninth voltage not higher than the second voltage when the n-type sense amplifier activating voltage is set to the second voltage and data is restored in said capacitor of said memory cell.

11. A device according to claim 1, in which a difference between the precharge voltage of said plurality of bit lines and a ground voltage is not higher than a threshold voltage of said first and second n-channel FETs.

12. A semiconductor integrated circuit device comprising:

a plurality of word lines;

a plurality of bit lines;

a plurality of memory cells each of which is arranged at an intersection of said word line and said bit line, and has a capacitor capable of storing data having one of at least two voltages, and a transfer gate transistor for controlling connection between said capacitor and said bit line in accordance with a voltage of said word line;

an n-type sense amplifier having a first n-channel FET with a drain connected to a first bit line of said plurality of bit lines and a gate connected to a second bit line, and a second n-channel FET with a drain connected to said second bit line and a gate connected to said first bit line; and a p-type sense amplifier having a first p-channel FET with a drain connected to said first bit line and a gate connected to said second bit line, and a second p-channel FET with a drain connected to said second bit line and a gate connected to said first bit line, and in which data stored in said capacitor is transmitted to either one of said first and second bit lines precharged to a precharge voltage which is an intermediate voltage of a power supply voltage to generate a small voltage difference between said first and second bit lines, a first voltage which is lower than a low voltage of the power supply voltage is applied to sources of said first and second n-channel FETs to discharge one of the first and second n-channel FETs which has a lower voltage after said data transmission from said capacitor, the voltage difference between said first voltage and voltage of either one of said first and second bit lines before said discharging is larger than threshold voltages of said first and second n-channel FTEs, the other of said first and second bit lines is charged through one of said p-channel FETs of which gate is connected to one of said first and second bit lines which has a lower voltage after said data transmission from said capacitor, thereby amplifying the small voltage difference generated between said first and second bit lines.

13. A device according to claim 12, in which a second voltage higher than the first voltage and substantially equal to the lowest voltage of data stored in said capacitor is applied instead of the first voltage to said sources of said first and second n-channel FETs in restoring data in said memory cells.

14. A device according to claim 13, in which a second voltage is equal to the low voltage of the power supply voltage.

15. A device according to claim 12, in which, while at least said first and second bit lines have a voltage difference, a word line in a standby state or a non-selected state has such a voltage as to prevent a difference between a voltage of a low-voltage bit line of said first and second bit lines having the voltage difference and a voltage of a gate of said transfer gate transistor from exceeding a threshold voltage of said transfer gate transistor.

16. A device according to claim 12, which further comprises:

a gate circuit, connected to said first and second bit lines at a position between said n-type sense amplifier and said memory cell, for electrically connecting/disconnecting said n-type sense amplifier to/from said memory cell, and in which said gate circuit comprises a third n-channel FET with a current path series-inserted in said first bit line, and a fourth n-channel FET with a current path series-inserted in said second bit line, and a third voltage substantially equal to the first voltage is applied to gate terminals of said third and fourth n-channel FETs in electrically disconnecting said n-type sense amplifier from said memory cell.

17. A device according to claim 16, in which said n-type sense amplifier and said memory cell are electrically disconnected while said n-type sense amplifier performs amplification.

18. A device according to claim 12, which further comprises:

a gate circuit connected to said first and second bit lines at a position between said n-type sense amplifier and said memory cell, and in which said gate comprises a third p-channel FET with a current path series-inserted in said first bit line, and a fourth p-channel FET with a current path series-inserted in said second bit line, and the gate of the third and fourth p-channel FETs are connected to a second voltage not lower than the first voltage and the voltage difference between portions of the first and second bit lines on said memory cell side is set higher than the second voltage by the threshold voltage of the third and fourth p-channel FETs while at least said n-type sense amplifier performs amplification.

* * * * *

UNITED STATES PATENT AND TRADEMARK OFFICE

CERTIFICATE OF CORRECTION

PATENT NO.: 5,970,007

DATED: October 19, 1999

INVENTOR: Shinichiro SHIRATAKE

It is certified that an error appears in the above-identified patent and that said Letters Patent is hereby corrected as shown below:

Claim 12, column 20, line 53, delete "FTEs" and insert --FETs--.

Signed and Sealed this

Seventh Day of November, 2000

Attest:

Q. TODD DICKINSON

*Attesting Officer*

*Director of Patents and Trademarks*